(12) United States Patent
Odawara

(10) Patent No.: US 12,261,252 B2
(45) Date of Patent: Mar. 25, 2025

(54) LIGHT-EMITTING DEVICE AND MANUFACTURING METHOD OF THE SAME

(71) Applicant: STANLEY ELECTRIC CO., LTD., Tokyo (JP)

(72) Inventor: Masaki Odawara, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 462 days.

(21) Appl. No.: 17/720,383

(22) Filed: Apr. 14, 2022

(65) Prior Publication Data

US 2022/0344552 A1 Oct. 27, 2022

(30) Foreign Application Priority Data

Apr. 22, 2021 (JP) .................................. 2021-72385

(51) Int. Cl.
| | |
|---|---|
| H01L 33/56 | (2010.01) |
| H01L 33/00 | (2010.01) |
| H01L 33/40 | (2010.01) |
| H01L 33/62 | (2010.01) |

(52) U.S. Cl.
CPC ............ *H01L 33/56* (2013.01); *H01L 33/005* (2013.01); *H01L 33/40* (2013.01); *H01L 33/62* (2013.01); *H01L 2933/0016* (2013.01); *H01L 2933/005* (2013.01)

(58) Field of Classification Search
CPC .................................................. H01L 33/486
See application file for complete search history.

(56) References Cited

U.S. PATENT DOCUMENTS

| | | | | |
|---|---|---|---|---|
| 2009/0321750 A1* | 12/2009 | Namioka | .............. | H01L 33/486 |
| | | | | 257/E33.056 |
| 2012/0120671 A1* | 5/2012 | Yamashita | ............. | H05K 13/00 |
| | | | | 29/829 |
| 2013/0156058 A1* | 6/2013 | Yamashita | ............ | H01S 5/0232 |
| | | | | 216/17 |
| 2018/0315897 A1* | 11/2018 | Nakabayashi | .......... | H01L 33/36 |
| 2019/0198731 A1* | 6/2019 | Watanabe | ............. | H01L 33/486 |

FOREIGN PATENT DOCUMENTS

JP     2003188424 A    7/2003

* cited by examiner

*Primary Examiner* — Erik Kielin
(74) *Attorney, Agent, or Firm* — Holtz, Holtz & Volek PC

(57) ABSTRACT

A light-emitting device according to the present invention includes a resin substrate having a flat plate shape, a first wiring electrode made of metal, a second wiring electrode made of metal, a light-emitting element, and a resin body. The light-emitting element is mounted onto the electrode portions of the first wiring electrode and the second wiring electrode on the first principal surface side of the resin substrate. The resin body has a light reflection property, covers the first principal surface of the resin substrate, covers the respective wiring portions of the first wiring electrode and the second wiring electrode and forming a frame body surrounding the light-emitting element on the first principal surface, and covers a region exposed from the first wiring electrode and the second wiring electrode on the second principal surface of the resin substrate.

9 Claims, 24 Drawing Sheets

LIGHT-EMITTING DEVICE AND MANUFACTURING METHOD OF THE SAME

BACKGROUND

1. Technical Field

The present invention relates to a light-emitting device and a method for manufacturing the light-emitting device.

2. Description of the Related Art

As a small-sized light-emitting device using a light-emitting element such as a Light-Emitting Diode (LED) as a light source, there is known a light-emitting device that is constituted of a flat plate-shaped mounting substrate, a light-emitting element disposed on the mounting substrate, and a sealing resin disposed so as to cover the light-emitting element.

There is known a side light-emitting type (hereinafter also referred to as a side-view type) light-emitting device where an external electrode is formed on one side surface of the above-described light-emitting device and the one side surface is used as a mounting surface.

For example, JP-A-2003-188424 discloses a surface-mounting type light-emitting diode of the side light-emitting type that has a light emitting diode element disposed on a flat plate-shaped manufacturing substrate having a rectangular upper surface shape constituted of a glass epoxy-based insulating substrate, a metal thin plate, and a copper foil and is formed such that the light emitting diode element is covered with a sealing resin portion made of a translucent resin on the manufacturing substrate.

However, in the surface-mounting type light-emitting diode of the side light-emitting type disclosed in JP-A-2003-188424, due to a difference of thermal expansion coefficients between the manufacturing substrate and the sealing resin portion, a warpage amount of the manufacturing substrate changes between a high temperature period by solder joining when the light-emitting element is mounted on a mounting substrate and a normal temperature state, in some cases. Due to a variation of the warpage amount of the manufacturing substrate, a problem such as a crack of solder or a crack of the mounted light emitting diode element is likely to occur.

SUMMARY OF THE INVENTION

The present invention has been made in consideration of the problems, and an object of the present invention is to provide a light-emitting device where a manufacturing yield can be improved by reducing a variation of a warpage amount of a mounting substrate between a high temperature period at, for example, heat treatment during manufacturing and a normal temperature state and a method for manufacturing the light-emitting device.

A light-emitting device according to the present invention includes a resin substrate, a first wiring electrode, a second wiring electrode, a light-emitting element, and a resin body. The resin substrate has a flat plate shape. The resin substrate has a planar surface shape where a first region including an apex at one end of one long side of a rectangle and a second region including an apex at the other end are cut out and having a first through hole and a second through hole passing through from a first principal surface up to a second principal surface. The first wiring electrode is made of metal and includes an electrode portion and a wiring portion. The electrode portion fills the first through hole. The wiring portion extends from the electrode portion on the second principal surface side up to the first principal surface through a side surface facing the first region of the resin substrate and exposes a region along the other long side of the rectangle of the resin substrate on the first principal surface and the second principal surface. The second wiring electrode is made of metal and includes an electrode portion and a wiring portion. The electrode portion fills the second through hole. The wiring portion extends from the electrode portion on the second principal surface side up to the first principal surface through a side surface facing the second region of the resin substrate and exposes a region along the other long side of the rectangle of the resin substrate on the first principal surface and the second principal surface. The light-emitting element is mounted onto the electrode portions of the first wiring electrode and the second wiring electrode on the first principal surface side of the resin substrate. The resin body has a light reflection property. The resin body covers the first principal surface of the resin substrate, covers the respective wiring portions of the first wiring electrode and the second wiring electrode and forming a frame body surrounding the light-emitting element on the first principal surface, and covers a region exposed from the first wiring electrode and the second wiring electrode on the second principal surface of the resin substrate. The first wiring electrode and the second wiring electrode have thicknesses on the second principal surface larger than the thicknesses on the first principal surface.

A manufacturing method of a light-emitting device includes: preparing a resin substrate having a plurality of element mounting regions defined in a shape of rectangle by grid-like dividing lines on a first principal surface; adhering a first copper foil onto the first principal surface of the resin substrate and adhering a second copper foil having a thickness larger than the first copper foil onto a second principal surface opposed to the first principal surface of the resin substrate; forming cutout portions where a first region including an apex at one end of one long side of the rectangle and a second region including an apex at the other end are cut out and forming a first through hole and a second through hole by causing two regions of the element mounting regions to pass through from the first copper foil up to the second principal surface to form a first through hole and a second through hole; forming a metal layer made of copper so as to fill the cutout portions, the first through hole, and the second through hole and so as to cover an upper surface of the first copper foil and a lower surface of the second copper foil; forming patterns of the first copper foil, the second copper foil, and the metal layer into shapes of a first wiring electrode and a second wiring electrode, on the first principal surface and the second principal surface; forming a resin body having a light reflection property so as to form a frame body surrounding the element mounting region on the first principal surface and so as to cover regions exposed from the first wiring electrode and the second wiring electrode on the second principal surface; mounting a light-emitting element on respective upper surfaces of the first wiring electrode and the second wiring electrode on the first principal surface side.

BRIEF DESCRIPTION OF THE DRAWINGS

Features of the present invention will be described below with reference to the accompanying drawings.

DETAILED DESCRIPTION OF THE INVENTION

Figure 1:
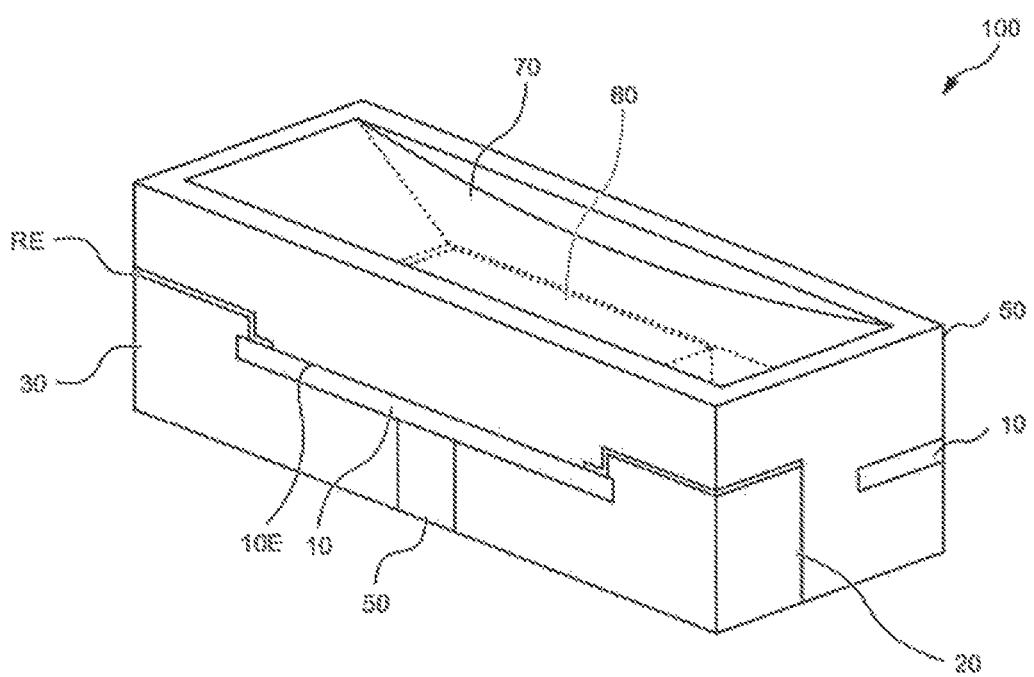
FIG. 1 is a perspective view of a light-emitting device according to an embodiment of the present invention.

The following describes an embodiment of the present invention in detail using FIGS. 1 to 7. Note that the same reference numerals are given to substantially identical or equivalent parts in the description and the accompanying drawings. In the following description, the description of "material 1/material 2" indicates a stacked structure where the material 2 is stacked on the material 1. The description of "material 1-material 2" indicates an alloy made of the material 1 and the material 2.

Figure 2:
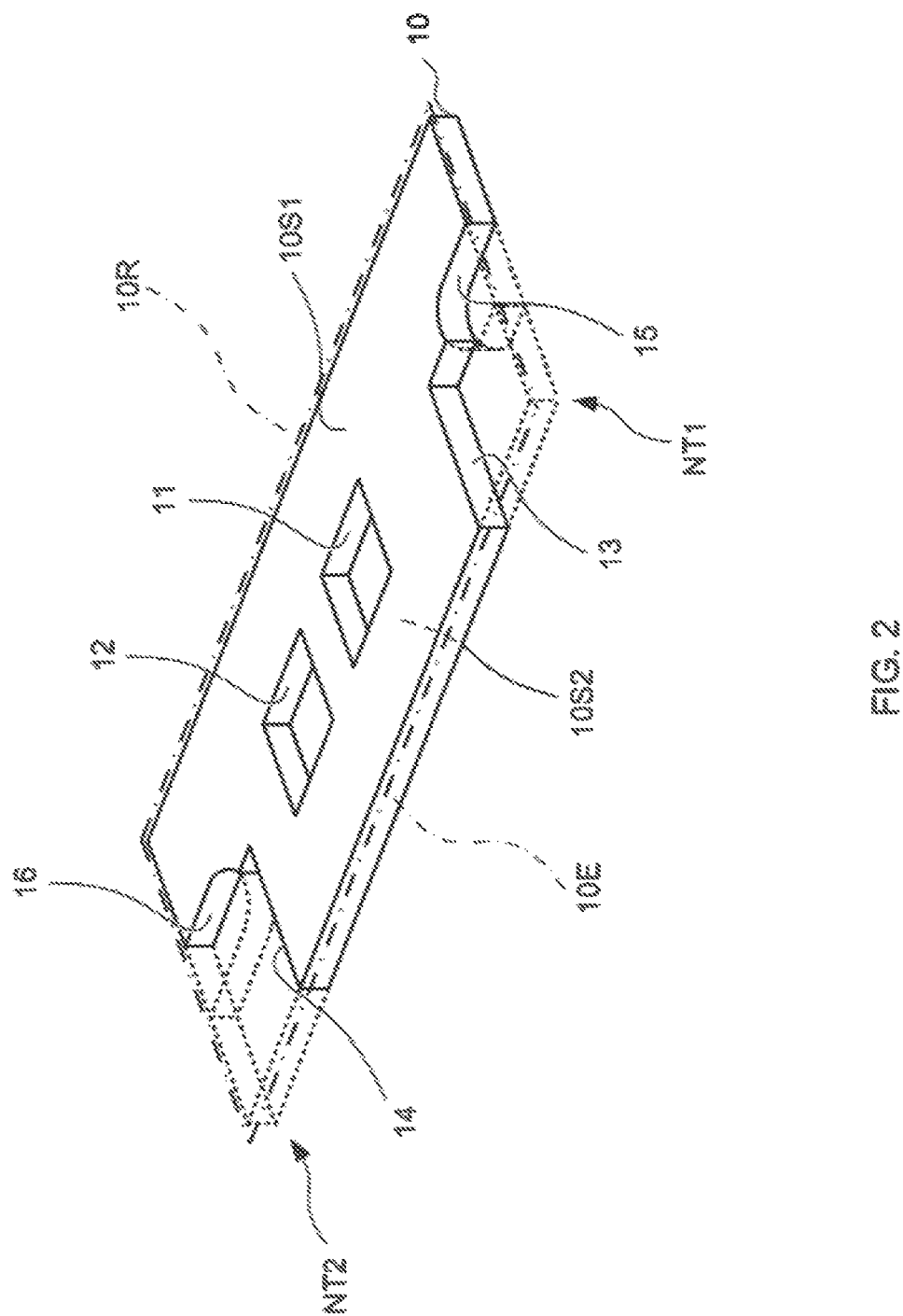
FIG. 2 is a perspective view of a resin substrate of the light-emitting device according to the embodiment of the present invention.
Figure 3:
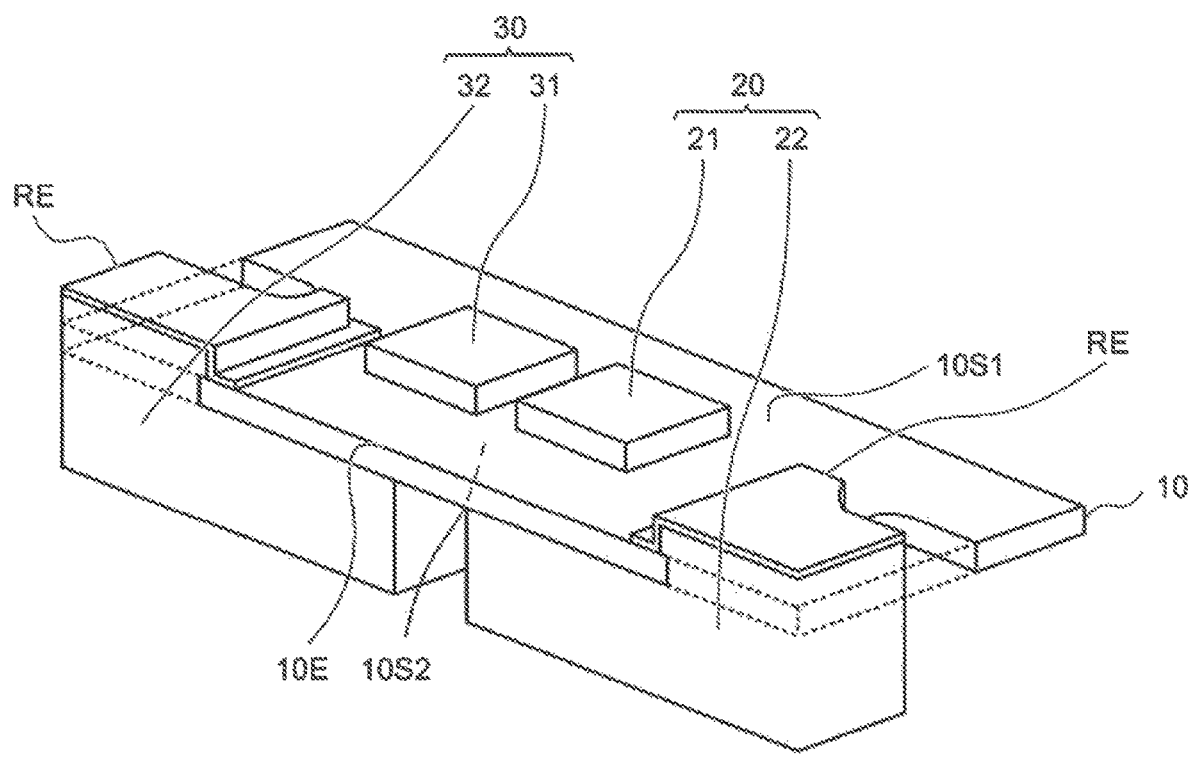
FIG. 3 is a perspective view of the resin substrate and wiring electrodes of the light-emitting device according to the embodiment of the present invention.
Figure 4:
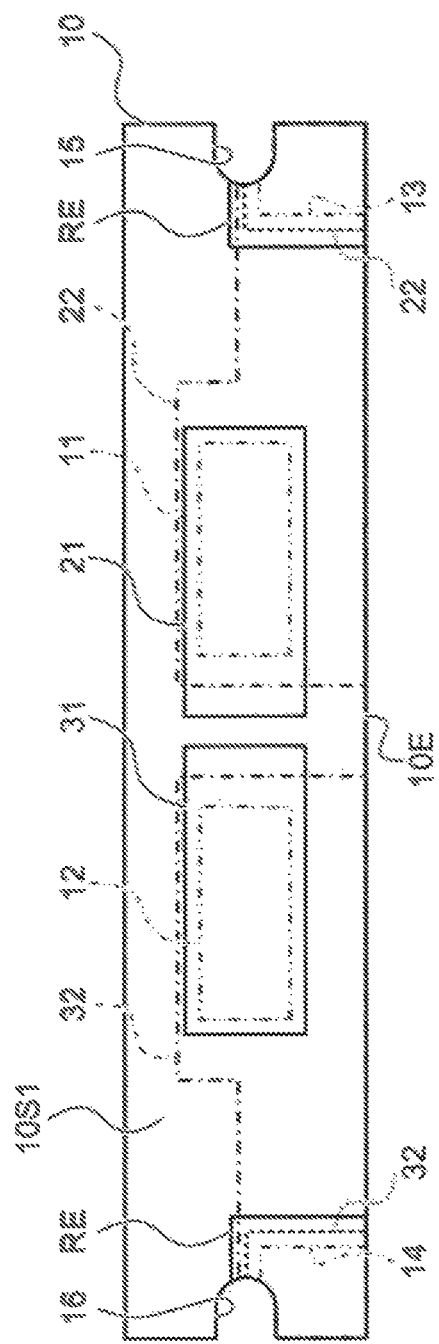
FIG. 4 is a top view of the resin substrate and the wiring electrodes of the light-emitting device according to the embodiment of the present invention.
Figure 5:
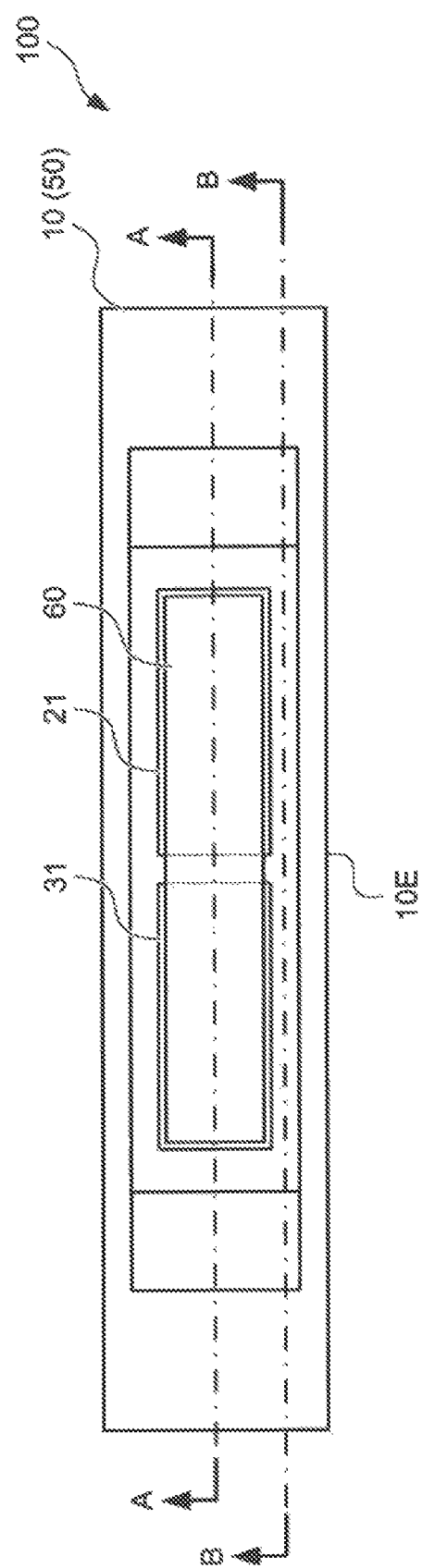
FIG. 5 is a top view of the light-emitting device according to the embodiment of the present invention.
Figure 6:
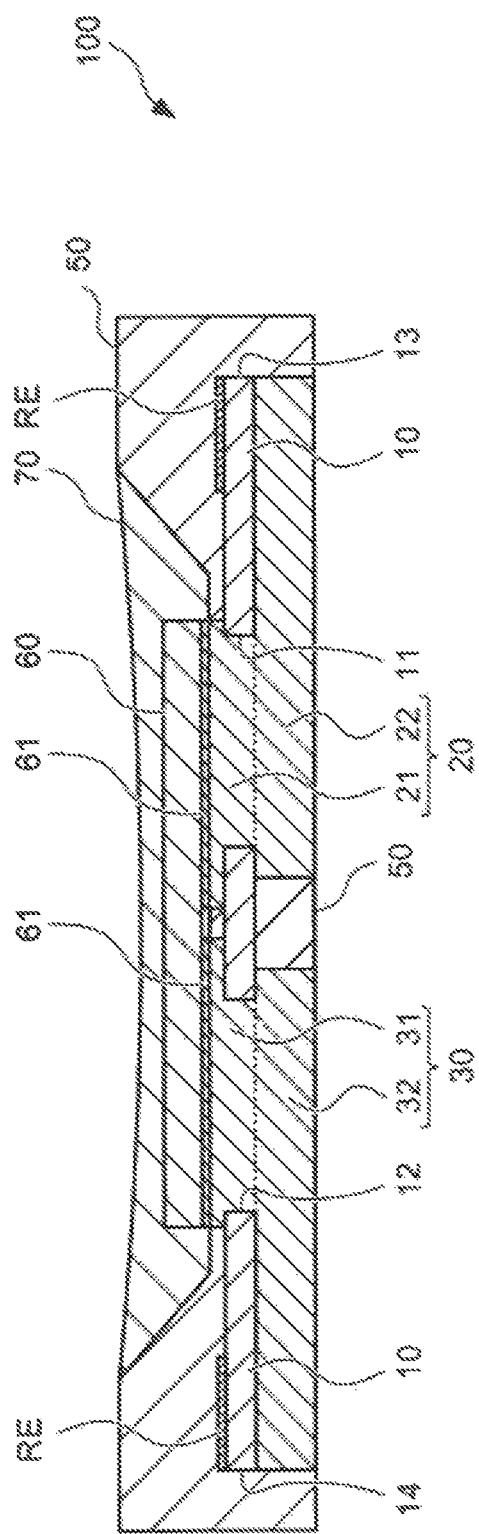
FIGS. 6 and 7 are cross-sectional views of the light-emitting device according to the embodiment of the present invention.
Figure 7:
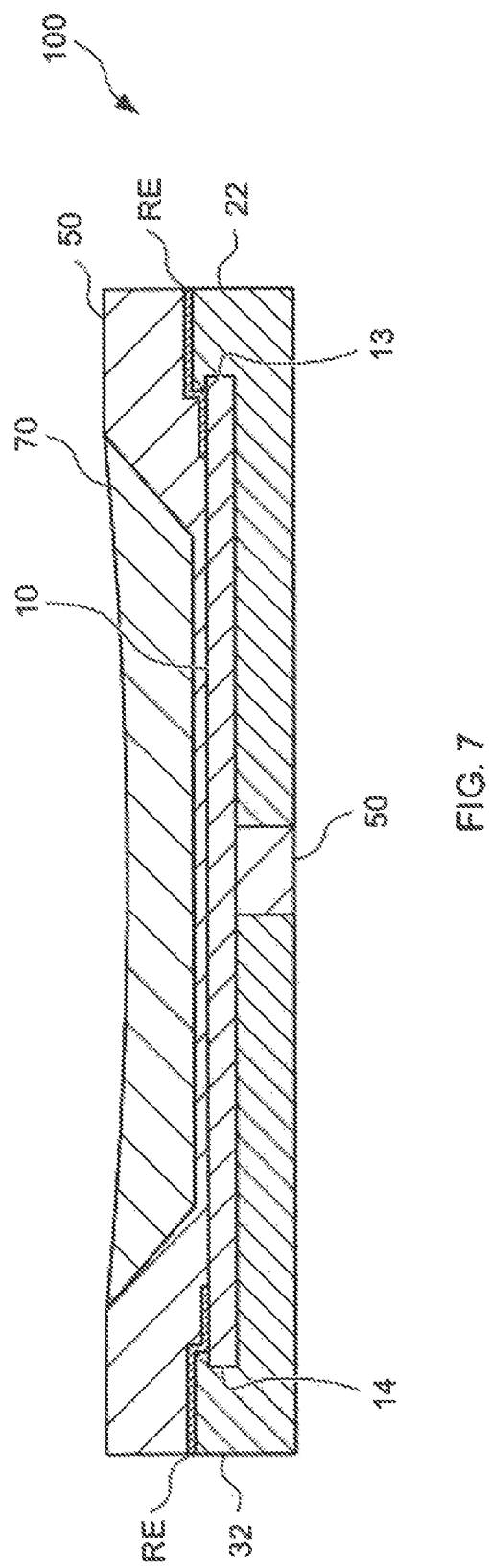

FIG. 1 illustrates a perspective view of a light-emitting device 100. FIG. 2 illustrates a perspective view of a resin substrate 10. FIG. 3 illustrates a perspective view of the resin substrate 10, a first wiring electrode 20, and a second wiring electrode 30. FIG. 4 illustrates a top view of the resin substrate 10, the first wiring electrode 20, and the second wiring electrode 30. FIG. 5 illustrates a top view of the light-emitting device 100. FIG. 6 illustrates a cross-sectional view taken along a line A-A of the light-emitting device 100 in FIG. 5. FIG. 7 illustrates a cross-sectional view taken along a line B-B of the light-emitting device 100 in FIG. 5.

The light-emitting device 100 includes the resin substrate 10, the first wiring electrode 20 and the second wiring electrode 30 formed in the resin substrate 10, a resin body 50 formed so as to have a cavity on the resin substrate 10, a light-emitting element 60 disposed on the resin substrate 10, and a sealing resin 70 filled inside the cavity of the resin body 50 so as to cover the light-emitting element 60. In FIG. 5, the sealing resin 70 is not illustrated so as to indicate a structure inside the cavity of the resin body 50.

The resin substrate 10 is, for example, a flat plate-shaped substrate having an upper surface 10S1 as a first principal surface and a lower surface 10S2 as a second principal surface, which are made of a substrate having an insulation property. The resin substrate 10 is, for example, a plate-shaped insulating substrate made of a glass epoxy where glass fibers are impregnated with an epoxy resin and then a thermosetting treatment is performed.

As illustrated in FIG. 2, the resin substrate 10 has a first through hole 11 and a second through hole 12 that are separated from one another and pass through from the upper surface 10S1 up to the lower surface 10S2.

As illustrated in FIG. 2, the resin substrate 10 has a cutout portion 13 where a first region NT1 including an apex at one end of a first long side 10E as one long side is cut out from the upper surface shape of a rectangle 10R. As illustrated in FIG. 2, the resin substrate 10 has a cutout portion 14 where a second region NT2 including an apex at the other end of the first long side 10E is cut out from the upper surface shape of the rectangle 10R.

In other words, the light-emitting device 100 includes the flat plate-shaped resin substrate 10 having a planar shape in which the cutout portion 13 where the first region NT1 including the apex at one end of the first long side 10E as one long side of the rectangle 10R is cut out and the cutout portion 14 where the second region NT2 including the apex at the other end of the first long side 10E is cut out are formed and has the first through hole 11 and the second through hole 12 passing through from the upper surface 10S1 up to the lower surface 10S2.

While the resin substrate 10 has the cutout portions 13, 14 at both end portions of the first long side 10E, cutout portions are not formed at end portions of a second long side opposed to the first long side 10E, and the respective end portions of the second long side are formed at a right angle with respective adjacent short sides.

In each of the short sides of the rectangle 10R, the resin substrate 10 has a third through hole 15 and a fourth through hole 16 both having a semicircular shape or a half oblong shape that each pass through from the upper surface 10S1 up to the lower surface 10S2 so as to be in contact with the side surface of the short side and each of the cutout portions 13 and 14. In FIG. 4, regions defined by two-dot chain lines indicate regions where the through holes are formed and that are cutout, in the resin substrate 10. That is, the regions defined by two-dot chain lines indicate the first through hole 11, the second through hole 12, the respective end portions of the cutout portion 13 and the cutout portion 14, namely, the end portions of the resin substrate 10, respectively.

The resin substrate 10 has a first wiring electrode 20 and a second wiring electrode 30 that are a pair of wiring electrodes formed separated from one another. The first wiring electrode 20 has a first electrode portion 21 as an electrode portion filling the first through hole 11 of the resin substrate 10. The second wiring electrode 30 has a second electrode portion 31 as an electrode portion filling the second through hole 12 of the resin substrate 10. On the lower surface 10S2 side of the resin substrate 10, the first wiring electrode 20 has a first wiring portion 22 as a wiring portion extending from a portion of the first electrode portion 21 up to the upper surface 10S1 through a side surface of the cutout portion 13, and the second wiring electrode 30 has a second wiring portion 32 as a wiring portion extending from a portion of the second electrode portion 31 up to the upper surface 10S1 through a side surface of the cutout portion 14.

In other words, the light-emitting device 100 includes the first wiring electrode 20 made of metal that has the first electrode portion 21 filling the first through hole 11 and the first wiring portion 22 as a wiring portion extending from the first electrode portion 21 on the lower surface 10S2 side to the upper surface 10S1 through the side surface of the resin substrate 10 facing the cutout portion 13. The light-emitting device 100 includes the second wiring electrode 30 made of metal that has the second electrode portion 31 filling the second through hole 12 and the second wiring portion 32 extending from the second electrode portion 31 on the lower surface 10S2 side to the upper surface 10S1 through the side surface of the resin substrate 10 facing the cutout portion 14. The first wiring electrode 20 and the second wiring electrode 30 are made of copper.

In FIG. 4, regions defined by the solid lines so as to surround each of the first through hole 11 and the second through hole 12 indicate respective end portions of the first electrode portion 21 and the second electrode portion 31 in a top view that are formed on the side of the upper surface 10S1 of the resin substrate 10, respectively. In FIG. 4, the first wiring portion 22 and the second wiring portion 32 indicated by the one dot chain lines indicate respective end portions of the first wiring portion 22 and the second wiring portion 32 in a top view that are formed on the lower surface 10S2 side of the resin substrate 10, respectively. In FIG. 4, the first wiring portion 22 and the second wiring portion 32 indicated by the dashed lines indicate respective end portions of the first wiring portion 22 and the second wiring portion 32 in a top view that are formed on the upper surface 10S1 side of the resin substrate 10, respectively.

Each of the first wiring electrode 20 and the second wiring electrode 30 is a metal electrode made of, for example, copper. Each of the first wiring electrode 20 and the second wiring electrode 30 is constituted of, for example, by a manufacturing method described later, a copper foil formed on the upper surface 10S1 and the lower surface 10S2 of the resin substrate 10 and copper formed on an exposed surface of the copper foil by plating.

As illustrated in FIGS. 3, 4, and 6, the first electrode portion 21 is formed so as to fill the first through hole 11 of the resin substrate 10. The second electrode portion 31 is formed so as to fill the second through hole 12 of the resin substrate 10. The first electrode portion 21 and the second electrode portion 31 are formed so as to protrude upward from the upper surface 10S1 of the resin substrate 10. Respective upper surfaces of the first electrode portion 21 and the second electrode portion 31 are formed so as to have a height approximately identical to that of the upper surface 10S1 of the resin substrate 10.

The light-emitting element is mounted on the first electrode portion 21 and the second electrode portion 31 via an element bonding layer, and an electrode of the light-emitting element is electrically connected to the first electrode portion 21 and the second electrode portion 31.

As illustrated in FIGS. 4, 6, and 7, on the lower surface 10S2 of the resin substrate 10, each of the first wiring portion 22 and the second wiring portion 32 is formed so as to cover each of the first electrode portion 21 and the second electrode portion 31 formed inside each of the first through hole 11 and the second through hole 12.

On the lower surface 10S2 of the resin substrate 10, the first wiring portion 22 and the second wiring portion 32 are respectively formed so as to extend from the first electrode portion 21 and the second electrode portion 31 to the side surface along the first long side 10E.

Each of the first wiring portion 22 and the second wiring portion 32 is formed so as to fill each of the cutout portions 13 and 14 of the resin substrate 10 and extend to the upper surface 10S1 through each of the cutout portions 13 and 14. Respective upper surfaces of the first wiring portion 22 and the second wiring portion 32 are formed so as to have a height from the upper surface 10S1 of the resin substrate 10 approximately identical to the heights of the respective upper surfaces of the first electrode portion 21 and the second electrode portion 31.

As illustrated in FIGS. 2 and 3, in the short sides of the rectangle 10R of the resin substrate 10, each of the first wiring portion 22 and the second wiring portion 32 is formed in a region along respective side surfaces of the third through hole 15 and the fourth through hole 16. In the short sides of the rectangle 10R of the resin substrate 10, each of the first wiring portion 22 and the second wiring portion 32 is formed from a region where each of the third through hole 15 and the fourth through hole 16 is formed to the region along the first long side 10E. On the lower surface 10S2 of the resin substrate 10, each of the first wiring portion 22 and the second wiring portion 32 is formed so as to expose a region along the second long side opposed to the first long side 10E. In other words, on the upper surface 10S1 and the lower surface 10S2, the first wiring electrode 20 and the second wiring electrode 30 expose the region along the second long side of the rectangle 10R of the resin substrate 10.

The first wiring portion 22 and the second wiring portion 32 are exposed on the mounting surface of the light-emitting device 100 to constitute a terminal electrode surface. The first wiring portion 22 and the second wiring portion 32 are also exposed on side surfaces adjacent to the mounting surface of the light-emitting device 100 to form perpendicular corner portions. The perpendicular corner portions are constituted without a metal burr by a method described later, and thus, mounting accuracy of the light-emitting device 100 can be enhanced.

In a portion formed on the upper surface 10S1 of the resin substrate 10, each of the first wiring portion 22 and the second wiring portion 32 is covered with a resist RE on the respective surfaces except the side surfaces along the side surfaces of the rectangle 10R of the resin substrate 10 and the side surfaces along the respective side surfaces of the third through hole 15 and the fourth through hole 16. In other words, on the upper surface 10S1, the respective surfaces of the first wiring portion 22 of the first wiring electrode 20 and the second wiring portion 32 of the second wiring electrode 30 are covered with the resist RE except the side surfaces along the side surfaces of the resin substrate 10.

Consequently, the surfaces parallel to the upper surface 10S1 on the upper surface 10S1 of the resin substrate 10 in the first wiring portion 22 and the second wiring portion 32 are covered with the resin body 50 via the resist RE.

In the embodiment, the resist RE is formed in a region that covers upper surfaces and side surfaces of respective portions of the first wiring electrode 20 and the second wiring electrode 30 formed on the upper surface 10S1 of the resin substrate 10 and reaches the upper surface 10S1 of the resin substrate 10.

On the upper surface 10S1 of the resin substrate 10, the resist RE is formed up to a region equal to or more than approximately 100 μm from the end portions of the first wiring electrode 20 and the second wiring electrode 30. That is, as illustrated in FIG. 4, the resist RE on the resin substrate 10 is formed in the regions from the respective end portions of the first wiring portion 22 and the second wiring portion indicated by dashed lines in a top view to the upper surface 10S1 of the resin substrate 10.

On the respective surfaces of the first wiring electrode 20 and the second wiring electrode 30 except the side surfaces along the side surfaces of the rectangle 10R of the resin substrate 10, the side surfaces along the respective side surfaces of the third through hole 15 and the fourth through hole 16, and the respective surfaces covered with the resist RE, a metal film made of nickel (Ni)/gold (Au) (not illustrated) is formed in order from the surfaces of the first wiring electrode 20 and the second wiring electrode 30. That is, in the first wiring portion 22 and the second wiring portion 32, the metal film made of nickel (Ni)/gold (Au) is not formed on cut surfaces by dicing described later, in the regions covered with the resist RE, and in the side surface regions along inner wall surfaces of the third through hole 15 and the fourth through hole. On the cut surfaces by the dicing, a metal film made of gold (Au) can be conveniently formed. In other words, the respective surfaces exposed from the resin substrate 10 of the first electrode portion 21 of the first wiring electrode 20 and the second electrode portion 31 of the second wiring electrode 30 have the metal films where nickel and gold are stacked in this order. That is, in the first electrode portion 21 and the second electrode portion 31, the metal films made of nickel (Ni)/gold (Au) are formed on the upper surfaces and side surfaces of the portions protruding upward from the upper surface 10S1 of the resin substrate 10.

In the portions on the upper surface 10S1 of the resin substrate 10 in the first wiring portion 22 and the second wiring portion 32, the metal films made of nickel (Ni)/gold (Au) are not formed, and the portions are constituted of copper foils and copper plating films. That is, the resist RE is formed on the copper plating film.

The metal film of Ni/Au formed as a metal film, in particular, Au of an outermost surface has a low adhesion property with the resin material such as the resist RE and the resin body 50 described below. Thus, forming the resist RE on the surface constituted of the copper foil and the copper plating and causing the resist RE to be in contact with the resin body 50 allows reduced separation between the resin body 50 and the first wiring portion 22 and between the resin body 50 and the second wiring portion 32. Since, the side surface regions of the first wiring portion 22 and the second wiring portion 32 along the inner wall surfaces of the third through hole 15 and the fourth through hole are constituted of the copper foil and the copper plating, and are directly contact with the resin body 50, it is possible to reduce the separation between the resin body and the first wiring portion 22 and between the resin body and the second wiring portion 32.

As illustrated in FIG. 1 and FIGS. 5 to 7, the resin body 50 is formed so as to have a concave cavity on an upper surface on the upper surface 10S1 of the resin substrate 10. The resin body 50 is formed so as to fill the third through hole 15 and the fourth through hole 16 and cover all the regions except the region where the first wiring portion 22 and the second wiring portion 32 are formed on the lower surface 10S2 of the resin substrate 10. The resin body 50 is, for example, a white color resin constituted of particles having a light scattering property made of titanium oxide (TiO2) or the like and a thermosetting resin material of a silicon resin or the like dispersed with the particles.

The resin body 50 is formed so as to cover the resist RE on the upper surface 10S1 of the substrate 10. The resin body 50 is formed so as to expose the upper surfaces of the first electrode portion 21 and the second electrode portion 31 on a bottom surface of the concave cavity. On the lower surface 10S2 of the substrate 10, the resin body 50 is formed so as to expose lower surfaces of the first wiring portion 22 and the second wiring portion 32 and the side surfaces along the side surfaces of the rectangle 10R of the substrate 10. On the lower surface 10S2 of the substrate 10, the resin body 50 is formed so as to have a thickness where a bottom surface of the resin body 50 and the lower surfaces of the first wiring portion 22 and the second wiring portion 32 are on an identical surface and fill a space between the first wiring portion 22 and the second wiring portion 32.

That is, the resin body 50 forms a frame body surrounding the light-emitting element 60 described below on the upper surface 10S1 of the resin substrate 10. In other words, the light-emitting device 100 includes the resin body 50 having a light reflection property that covers the upper surface 10S1 of the resin substrate 10, covers each of the first wiring portion 22 of the first wiring electrode 20 and the second wiring portion 32 of the second wiring electrode 30 and forms the frame body surrounding the light-emitting element 60 on the upper surface 10S1, and covers the regions exposed from the first wiring electrode 20 and the second wiring electrode 30 on the lower surface 10S2 of the resin substrate 10.

The resin body 50 is formed so as to sandwich the resin substrate 10, in particular, is formed so as to continuously sandwich the second long side opposed to the first long side 10E of the resin substrate 10. Then, the resin body 50 is formed so as to sandwich the corners formed by the second long side and the adjacent short sides of the resin substrate 10.

The resin body 50 is formed by filling the third through hole 15 and the fourth through hole 16 adjacent to the cutout portions 13, 14. Consequently, the resin body 50 is formed so as to be in contact with inner surfaces of the first wiring portion 22 and the second wiring portion 32 each exposed on the third through hole 15 and the fourth through hole 16.

Side surfaces of the resin body 50 are cut surfaces formed by an individualizing step of the light-emitting device 100, which is described later, and, as illustrated in FIG. 1, are formed on an identical surface with the side surfaces of the resin substrate 10, the side surfaces of the resist RE, the first wiring portion 22, and the second wiring portion 32, and constitute the side surfaces of the light-emitting device 100.

In the embodiment, the first wiring portion 22 and the second wiring portion 32 exposed on the side surface along the first long side 10E of the resin substrate 10 functions as a terminal electrode surface when the light-emitting device 100 is mounted onto a mounting substrate. That is, the light-emitting device 100 is a side-view type light-emitting device where the side surface along the first long side 10E of the resin substrate 10 functions as the mounting surface.

The resin body 50 is formed such that each of the inner surfaces formed on sides of the short sides of the rectangle 10R of the resin substrate 10 have inclination inside the cavity. The inner surfaces having the inclination causes the light emitted from the light-emitting element 60 and the sealing resin 70, which are described later, to be guided and collected toward an upper surface direction (an opening direction of the cavity) of the light-emitting device 100.

As illustrated in FIG. 6, the light-emitting element 60 is mounted onto each of the first electrode portion 21 and the second electrode portion 31 via an element bonding layer 61. The light-emitting element 60 is, for example, a semiconductor light-emitting element that emits blue color light where a gallium-nitride-based semiconductor layer is formed on one principal surface on a translucent growth substrate of sapphire or the like. The semiconductor layer is formed, for example, from the growth substrate side, in the order of n-type gallium nitride layer (n-GaN), indium gallium nitride (InGaN)-based quantum well type light-emitting layer, and a p-type gallium nitride layer (p-GaN). On a surface where the semiconductor layer of the light-emitting element 60 is formed, electrodes electrically connected to each of the n-GaN layer and the p-GaN layer are disposed. The electrode disposed on the n-GaN layer functions as a cathode electrode of the light-emitting element 60, and the electrode disposed on the p-GaN layer functions as an anode electrode. The light-emitting element 60 is mounted over on the respective upper surfaces of the first electrode portion 21 and the second electrode portion 31 with the semiconductor layer as a lower surface. That is, the surface where the electrodes of the light-emitting element 60 are formed is bonded to the respective upper surfaces of the first electrode portion 21 and the second electrode portion 31 via the element bonding layer 61. In other words, the light-emitting device 100 includes the light-emitting element 60 that is mounted on the first electrode portion 21 of the first wiring electrode 20 and the second electrode portion 31 of the second wiring electrode 30 on the upper surface 10S1 side of the resin substrate 10.

The light-emitting element 60 is bonded on the respective upper surfaces of the first electrode portion 21 and the second electrode portion 31 in an aspect of a flip chip where the light emitted from the semiconductor layer passes through the growth substrate and radiates upward. That is, the light-emitting element 60 functions as a light extraction surface where the semiconductor layer including a light-emitting layer is formed on the lower surface side and the light is emitted from the upper surface side. In the embodiment, while the case where the light-emitting element 60 is the light-emitting element in the aspect of the flip chip is described, the aspect of the light-emitting element 60 is not limited to this. Specifically, a light-emitting element having a conductive supporting substrate and having a semiconductor layer including a light-emitting layer and an electrode pad formed on an upper surface of the supporting substrate may be mounted. In that case, the light-emitting element is mounted onto one of the first electrode portion 21 or the second electrode portion 31, and the electrode pad of the light-emitting element is connected to the other of the first electrode portion 21 or the second electrode portion 31 by a conductive wire.

The element bonding layer 61 is, for example, a conductive adhesive made of the identical material. A raw material of the element bonding layer 61 is, for example, a paste where gold (Au)-tin (Sn) alloy particles are mixed. The paste is applied on the respective upper surfaces of the first electrode portion 21 and the second electrode portion 31, and the light-emitting element 60 is mounted on the paste such that each of the electrodes of the light-emitting element 60 is in contact with the paste, and then is heated. As a result, the Au—Sn particles included in the paste are melted and generate a eutectic reaction with the Au layers on the respective surfaces of the first electrode portion 21 and the second electrode portion 31, and thus, the respective electrodes of the light-emitting element 60 are eutectically bonded to each of the first electrode portion 21 and the second electrode portion 31. The material of the element bonding layer 61 is not limited to the Au—Sn paste, and a material such as solder paste or silver paste may be used.

The sealing resin 70 is a resin layer filled inside the cavity of the resin body 50 and formed so as to cover the light-emitting element 60. The sealing resin 70 may be one that includes, for example, a wavelength converting material and a light scattering material. In the embodiment, the sealing resin 70 is, for example, a wavelength converter where phosphor particles performing a wavelength conversion with respect to the light emitted from each of the light-emitting elements 60 are dispersed into the thermosetting resin material such as the translucent silicone resin. The phosphor particles are, for example, a phosphor made of yttrium aluminum garnet (YAG: Y3Al5O12) having doped cerium (Ce) as a main material. In the embodiment, the sealing resin 70 is a wavelength converter that performs the wavelength conversion of a part of the blue color light emitted from the light-emitting element 60 and emits white color light In the embodiment, the light-emitting device 100 is manufactured by forming a plurality of light-emitting devices 100 in the flat plate-shaped resin substrate 10 in a matrix and then dividing it by the dicing. That is, each of the side surfaces in a direction perpendicular to the upper surface 10S1 of the resin substrate 10 in the light-emitting device 100 is the cut surface by the dicing. Each of the first wiring electrode 20, the second wiring electrode 30, and the resist RE that are formed in the regions along the respective sides of the rectangle 10R of the resin substrate 10 are exposed on the side surfaces of the light-emitting device 100 corresponding to the region. On the cut surfaces of the first wiring electrode 20 and the second wiring electrode 30 exposed on the side surfaces of the light-emitting device 100, a metal layer of Au is formed by plating after the dicing.

The resin substrate 10 is a plate-shaped substrate made of glass epoxy where a thermosetting treatment is performed by impregnating glass fibers with epoxy resin and has a thermal expansion coefficient of approximately 10 ppm/K to 20 ppm/K. Each of the first wiring electrode 20 and the second wiring electrode 30 is metal made of copper as a main material and has a thermal expansion coefficient of approximately 16.8 ppm/K. By containing the glass fibers in the resin substrate 10, the thermal expansion coefficient of the resin substrate 10 can be made close to that of the first wiring electrode 20 and the second wiring electrode 30. On the other hand, the resin body 50 is a resin made of the silicone resin as a main material and has a thermal expansion coefficient of approximately 200 ppm/K to 300 ppm/K. In other words, the resin body 50 has a thermal expansion coefficient higher than the resin substrate 10, the first wiring electrode 20, and the second wiring electrode 30.

Due to the difference of the thermal expansion coefficients between the resin substrate 10, the first wiring electrode 20 and the second wiring electrode 30, and the resin body 50, behavior of the warpage of them changes between the heat treatment and the normal temperature state in some cases. For example, at a time of cooling after the heat treatment when the light-emitting element 60 is eutectically bonded on the first wiring electrode 20 and the second wiring electrode 30, the resin body 50 shrinks larger than the resin substrate 10 and the respective wiring electrodes. As a result, the resin substrate 10, the first wiring electrode 20, the second wiring electrode 30, and the resin body 50 exhibit the behavior of upward concave-warpage. The warpage significantly appears in a direction along the long side direction of the substrate 10. The concave warpage is likely to cause a failure in manufacturing such as occurrence of a crack of the light-emitting element 60 mounted on the first wiring electrode 20 and the second wiring electrode 30.

In the embodiment, as illustrated in FIG. 4, on the lower surface 10S2 of the substrate 10, each of the first wiring portion 22 and the second wiring portion 32 is formed such that the region along the second long side opposed to the first long side 10E of the rectangle 10R of the substrate 10 is exposed.

In the embodiment, on the lower surface 10S2 of the substrate 10, each of the first wiring portion 22 and the second wiring portion 32 is disposed such that the resin body 50 is formed over both ends in the region along the second long side of the rectangle 10R of the substrate 10. That is, on the lower surface 10S2 of the substrate 10, the resin body 50 can be formed over both ends in the direction along the second long side direction opposed to the mounting surface of the light-emitting device 100.

If each of the first wiring portion 22 and the second wiring portion 32 is formed up to the region along the second long side opposed to the first long side 10E of the rectangle 10R of the substrate 10, the resin body 50 disposed on the lower surface 10S2 side of the substrate 10 is formed intermittently in the direction along the long side direction of the light-emitting device 100. In this case, a stress at a time of shrinkage after the heat treatment of the resin body 50 disposed on the upper surface 10S1 of the substrate 10 concentrates in a disconnected region of the resin body 50 on the lower surface of the substrate 10, and thus, the warpage is likely to occur.

In the embodiment, forming the resin body 50 over both ends in the direction along the long side direction on the lower surface 10S2 of the substrate 10 allows reduced stress concentration at a time of shrinkage after the heat treatment of the resin body 50 disposed on the upper surface 10S1 of the substrate 10.

In the embodiment, thicknesses on the lower surface side of the substrate 10 of the first wiring portion 22 and the second wiring portion 32 are formed so as to be larger than the thicknesses on the upper surface 10S1 side of the substrate 10. More preferably, the thicknesses on the lower surface side of the substrate 10 of the first wiring portion 22 and the second wiring portion 32 are formed to be larger than a total of the thicknesses on the upper surface 10S1 side of the substrate 10 and the thickness of the resin substrate 10. In other words, the first wiring electrode 20 and the second wiring electrode 30 have thicknesses on the lower surface 10S2 larger than the thicknesses on the upper surface 10S1. The respective thicknesses on the lower surface 10S2 of the first wiring electrode 20 and the second wiring electrode 30 are larger than the total thickness of the thickness of the resin substrate 10 and the respective thicknesses on the upper surface 10S1.

By forming each of the first wiring portion 22 and the second wiring portion 32 with the thicknesses as described above, it is possible to set the resin body 50 disposed on the upper surface 10S1 side of the substrate 10 and the resin body 50 disposed on the lower surface 10S2 side of the substrate 10 to have a close volume amount with one another.

By setting the volume amounts of the resin body 50 disposed on the upper surface 10S1 of the substrate 10 and the resin body 50 disposed on the lower surface 10S2 of the substrate 10 to be close with one another, it is possible that the light-emitting device 100 can uniformize balance of the stresses applied to the resin bodies 50 on the upper surface 10S1 side and the lower surface 10S2 side at a time of shrinkage after heating.

By having the above-described constitution, the light-emitting device 100 can reduce variation of the warpage amount of the mounting substrate between the high temperature period at, for example, the heating treatment in manufacturing and the normal temperature state.

The resin substrate 10 is formed, for example, to have a thickness of approximately 100 μm. The resin substrate 10 is formed with a long side dimension of approximately 1.7 mm and a short side dimension of approximately 0.4 mm, in the upper surface shape of the rectangle 10R before forming the respective cutout portions 13 and 14, and the respective through holes.

As described above, the first wiring electrode 20 and the second wiring electrode 30 are constituted of the copper foil formed on the upper surface 10S1 and the lower surface 10S2 of the resin substrate 10, and copper formed by plating on the exposed surface of the copper foil.

Specifically, the resin substrate 10 has the copper foils having a thickness of approximately 150 μm that are adhered over respective formation regions of the first wiring portion 22 and the second wiring portion 32, on the lower surface 10S2. The copper foils adhered on the lower surface 10S2 of the resin substrate 10 are adhered so as to cover the respective through holes and the respective cutouts in the respective formation regions of the first wiring portion 22 and the second wiring portion 32.

The resin substrate 10 has the copper foils having a thickness of approximately 20 μm that are adhered in the formation regions of the first electrode portion 21 and the second electrode portion 31 and in the formation regions of the first wiring portion 22 and the second wiring portion 32, on the upper surface 10S1. The copper foils adhered on the upper surface 10S1 of the resin substrate 10 are adhered in the regions except the respective through holes and the respective cutouts in the respective formation regions of the first electrode portion 21 and the second electrode portion 31.

Copper plating is performed so as to be stacked on the exposed surface of the copper foils adhered on the lower surface 10S2 of the resin substrate 10 and the copper foils adhered on the upper surface 10S1 and fill the respective through holes 11 and 12, and the respective cutout portions 13 and 14. Furthermore, a Ni/Au metal layer is applied to the lower surface of the resin substrate 10 and the copper plating. Copper plating/Ni plating/Au plating are stacked to have a thickness of approximately 30 μm on a lower surface of the copper foils adhered on the lower surface 10S2 of the resin substrate 10 and on an upper surface of the copper foils adhered on the upper surface 10S1 of the resin substrate 10.

That is, the respective electrode portions 21 and 31 and the respective wiring portions 22 and 32 formed on the upper surface 10S1 side of the resin substrate 10 are formed to have a thickness of approximately 50 μm from the upper surface 10S1. The respective wiring portions 22 and 32 formed on the lower surface 10S2 side of the resin substrate 10 are formed to have a thickness of approximately 180 μm from the lower surface 10S2.

That is, the thicknesses of the first wiring electrode 20 and the second wiring electrode 30 on the lower surface 10S2 are 180 μm and the first wiring electrode 20 and the second wiring electrode 30 are formed to have a larger thickness with respect to the 50 μm as the thicknesses of the first wiring electrode 20 and the second wiring electrode 30 on the upper surface 10S1. The first wiring electrode 20 and the second wiring electrode 30 on the lower surface 10S2 have a thickness of 180 μm, which is larger than 100 μm as the thickness of the resin substrate 10, and are formed to have a thickness larger than 150 μm as a total thickness of the thickness of the resin substrate 10 and the thicknesses of the first wiring electrode 20 and the second wiring electrode 30 on the upper surface 10S1.

The resin body 50 is formed to have a thickness of approximately 300 μm from the respective upper surfaces of the respective electrode portions 21 and 31 formed on the upper surface 10S1 of the substrate 10. The resin body 50 is formed such that the size of the opening of the cavity formed on the upper surface is approximately 1.5 mm on a long side and approximately 0.3 mm on a short side. That is, an inner wall of the cavity of the resin body 50 in a direction along the long side direction of the resin substrate 10 is formed to have a thickness of approximately 50 μm. Reducing the thickness of the inner wall of the cavity of the resin body 50 in the direction along the long side direction of the resin substrate 10 allows reducing the warpage applied in the long side direction of the resin substrate 10, in particular, reducing the variation of the warpage amount in the longitudinal direction of the resin substrate 10.

Next, using FIGS. 8 to 22, one example of a manufacturing procedure of the light-emitting device 100 will be described.

Figure 8:
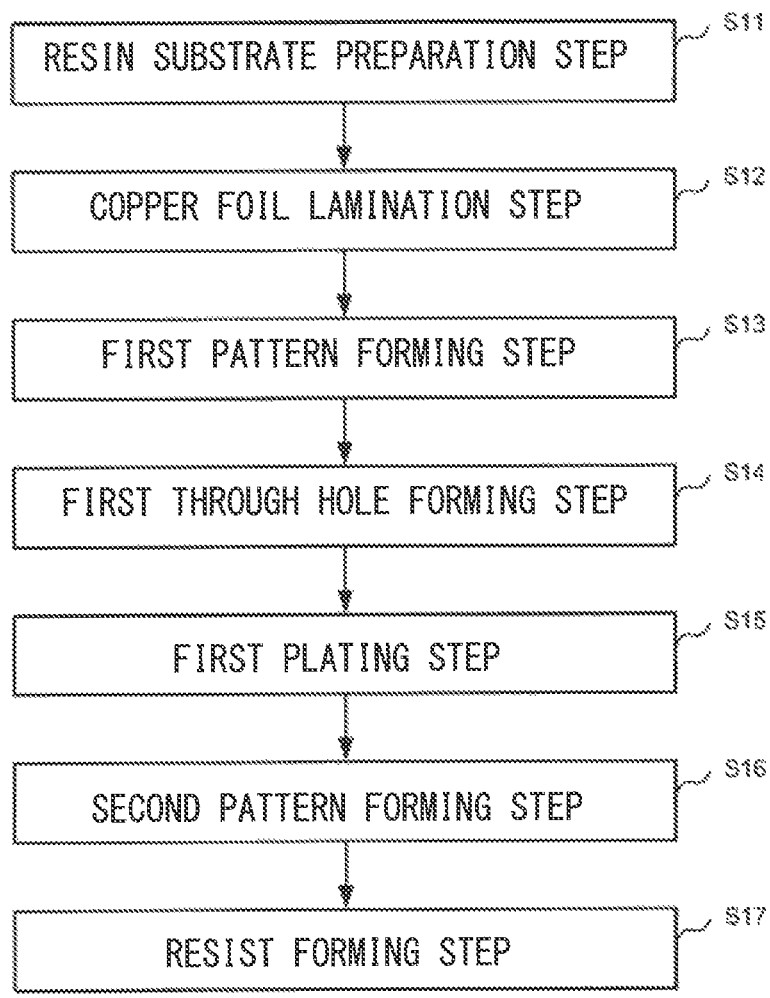
FIGS. 8 and 9 are diagrams illustrating a manufacturing flow of the light-emitting device according to the embodiment of the present invention.
Figure 9:
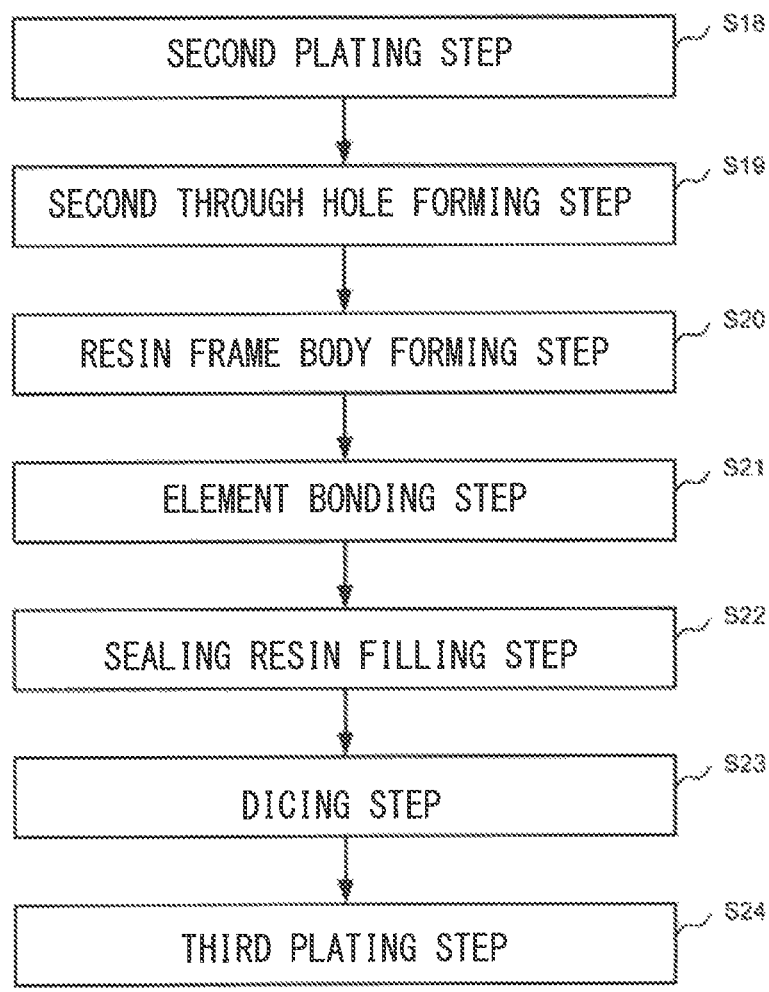

FIGS. 8 and 9 are diagrams illustrating a manufacturing flow of the light-emitting device 100 according to the embodiment of the present invention. FIGS. 10 to 12, FIGS. 14 and 15, and FIGS. 19 to 22 illustrate cross-sectional views of the light-emitting device 100 at each step of the manufacturing procedure illustrated in FIG. 8 or FIG. 9. In FIGS. 10 to 12, FIGS. 14 and 15, and FIGS. 19 to 22 illustrate cross-sectional views taken along a line A-A of the light-emitting device 100 in FIG. 5. FIG. 13, FIGS. 16 to 18 illustrate top views of the light-emitting device 100 at each step of the manufacturing procedure illustrated in FIG. 8 or FIG. 9.

First, a resin substrate preparation step of preparing the flat plate-shaped resin substrate 10 is performed (Step S11, the resin substrate preparation step).

Figure 10:
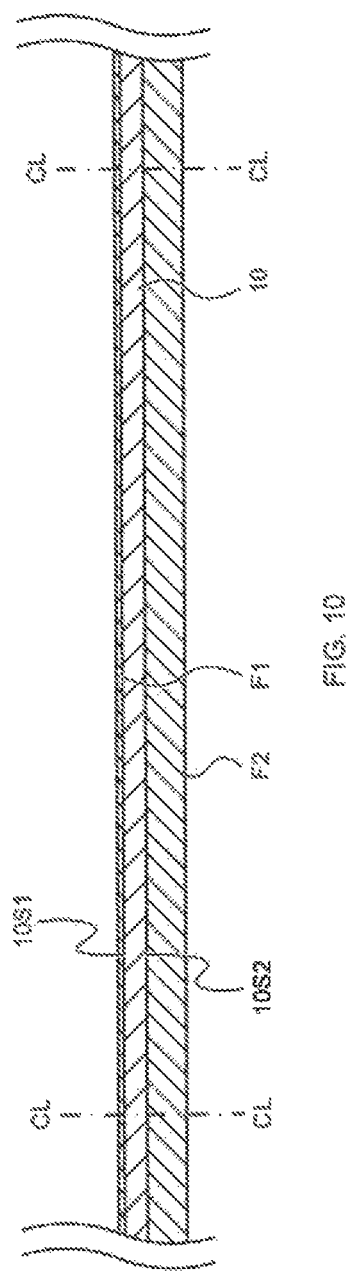
FIGS. 10, 11, and 12 are cross-sectional views in one step in manufacturing the light-emitting device according to the embodiment of the present invention.
Figure 11:
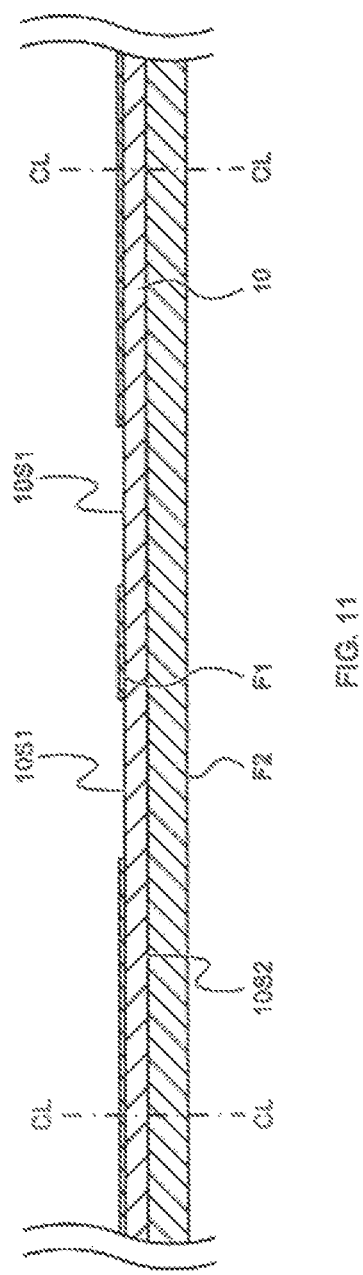

Nest, as illustrated in FIG. 10, a copper foil adhering step of adhering a first copper foil F1 on the upper surface 10S1 side of the resin substrate 10 and a second copper foil F2 on the lower surface 10S2 side (Step S12, the copper foil adhering step). The resin substrate 10, the first copper foil F1, and the second copper foil F2 are stacked in the order of the second copper foil F2, the resin substrate 10, and the first copper foil F1, from the lower side, and then, while being heated at a temperature of approximately 180° C., they are press-bonded by being pressed from up and down directions. The first copper foil F1 is a copper foil having a thickness of approximately 18 μm, and the second copper foil F2 is a copper foil having a thickness of approximately 150 μm.

As described above, a plurality of light-emitting devices 100 are manufactured in a matrix in the resin substrate 10. The light-emitting device 100 is manufactured in a matrix in each of the regions of the rectangle 10R defined by cut lines CL of the resin substrate 10. The plurality of light-emitting devices 100 formed in the resin substrate 10 are continuously formed in the direction along the long side direction of the light-emitting device 100 and, in the direction along the short side direction, are continuously formed via waste regions. In other words, the manufacturing method of the light-emitting device 100 includes the resin substrate preparation step of preparing the resin substrate 10 having a plurality of element mounting regions defined in a shape of the rectangle 10R by grid-like dividing lines on the upper surface 10S1 and the copper foil adhering step of adhering the first copper foil F1 on the upper surface 10S1 of the resin substrate 10 and adhering the second copper foil F2 having a thickness larger than the first copper foil F1 on the lower surface 10S2 opposed to the upper surface 10S1 of the resin substrate 10.

Next, from above the first copper foil F1, a pattern is formed so as to open the first copper foil F1 in regions where the first through hole 11, the second through hole 12, and the cutout portions 13 and 14 are formed of the resin substrate 10 (Step S13, a first pattern forming step). In the opening portions of the first copper foil F1, the upper surface 10S1 of the resin substrate 10 is exposed. In this step, for example, a mask is placed on the upper surface of the first copper foil F1, and the first copper foil F1 is opened by performing etching from above.

Figure 12:
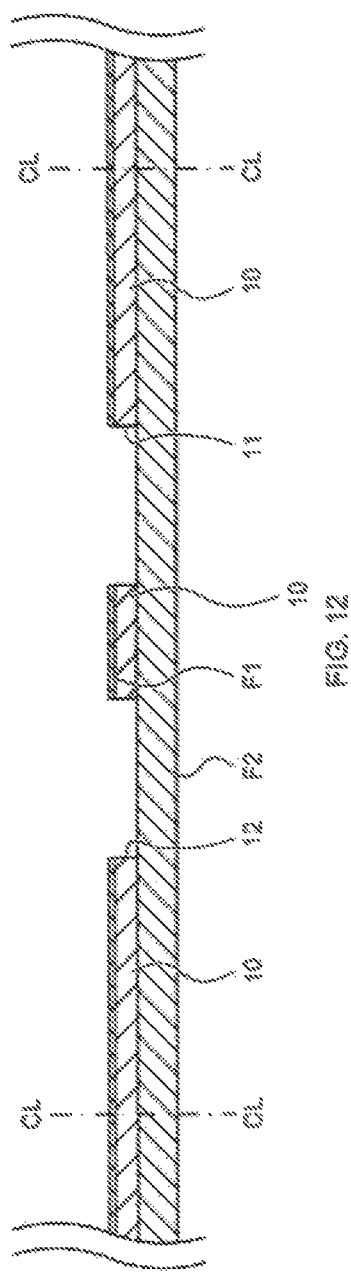

Next, as illustrated in FIG. 12, the first through hole 11, the second through hole 12, and the cutout portions 13 and 14 are formed by removing the resin substrate 10 in the opening portions of the first copper foil F1 so as to pass through up to an upper surface of the second copper foil F2 (Step S14, a first through hole forming step). In this step, a laser is irradiated to the opening portion of the first copper foil F1 from above, and the resin substrate 10 of the opening portion is removed so as to pass through up to an upper surface of the second copper foil F2.

Figure 13:
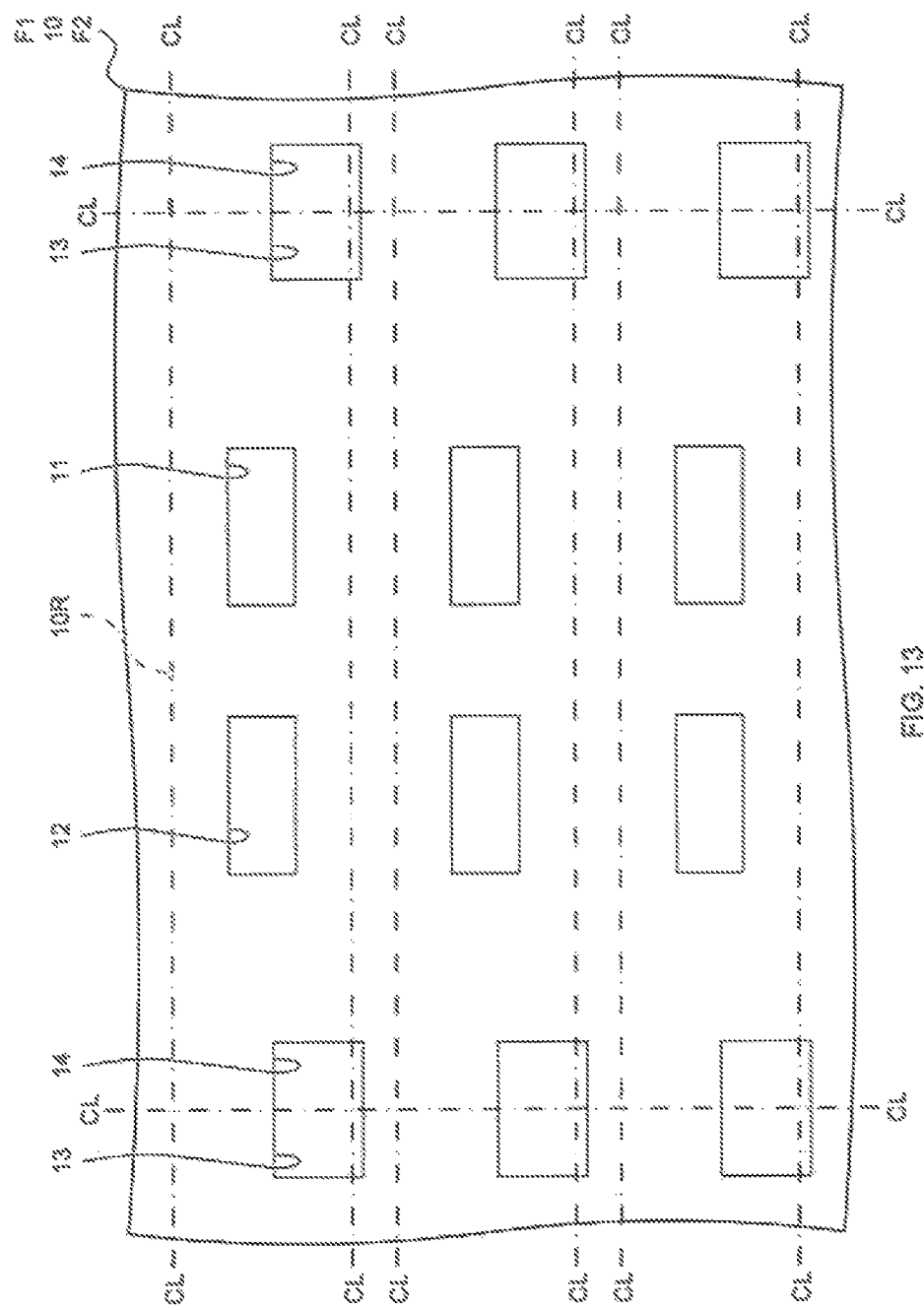
FIG. 13 is a top view in one step in manufacturing the light-emitting device according to the embodiment of the present invention.

As illustrated in FIG. 13, in this step, the first through hole 11 and the second through hole 12 are formed inside the region of the rectangle 10R defined by the cut lines CL of the resin substrate 10. In this step, the cutout portions 13 and 14 are collectively formed in the regions including the respective end portions of the respective first long sides 10E of the substrates 10 adjacent to one another in the long side direction of the resin substrate 10. That is, in the opening portion of the resin substrate 10 formed as the cutout portions 13 or 14, with the cut line CL interposed therebetween, one becomes the cutout portion 13 and the other becomes the cutout portion 14. In this step, the opening portion of the resin substrate 10 formed as the cutout portions 13 or 14 is formed so as to extend up to the waste region adjacent in a short side direction.

The laser irradiated to the resin substrate 10 is, for example, a laser light of, for example, Yttrium Aluminum Garnet (YAG). By irradiating the laser to the exposed portions of the resin substrate 10 and vaporizing the glass epoxy of the resin substrate 10, the first through hole 11, the second through hole 12, and the cutout portions 13 and 14 are formed. The first copper foil F1 and the second copper foil F2 are nor removed by the laser. A laser type that evaporates the glass epoxy is not limited to YAG. Specifically, for a laser type to be used, it is only necessary to use a laser having irradiation energy that can decompose a bond between epoxy resin and glass fibers of the glass epoxy and does not break metallic bonding of the first copper foil F1 and the second copper foil F2.

Step S13 and Step S14 described above are processed as a substrate shape forming step forming the shape of the resin substrate 10. In other words, the manufacturing method of the light-emitting device 100 includes the substrate shape forming step of forming the cutout portions 13 and 14 where the first region NT1 including the apex of one end of the first long side 10E of the rectangle 10R and the second region NT2 including the apex of the other end of the first long side 10E are cut out and forming the first through hole 11 and the second through hole 12 by causing two regions of the element mounting region to pass through from the first copper foil F1 up to the lower surface 10S2.

Figure 14:
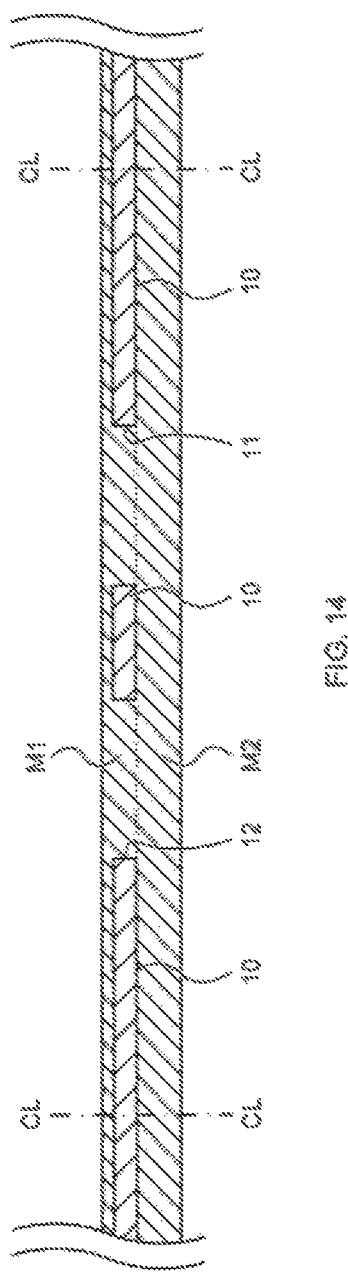
FIGS. 14 and 15 are cross-sectional views in one step in manufacturing the light-emitting device according to the embodiment of the present invention.

Next, as illustrated in FIG. 14, a copper plating step that forms a copper plating layer so as to fill the first through hole 11, the second through hole 12, and cutout portions 13 and 14 and cover each of the upper surface of the first copper foil F1 and the lower surface of the second copper foil F2 is performed (Step S15, a first plating step). In this step, a portion constituted of the first copper foil F1 and the copper plating layer is set as a metal portion M1, and the portion constituted of the second copper foil F2 and the copper plating layer is set as a metal portion M2. In other words, the manufacturing method of the light-emitting device 100 includes a copper plating step of forming metal layers made of copper so as to fill the cutout portions 13 and 14, the first through hole 11, and the second through hole 12 and cover the upper surface of the first copper foil F1 and the lower surface of the second copper foil F2.

In this step, the copper plating layer formed on the upper surface of the first copper foil F1 and the lower surfaces of the second copper foil F2 is formed to have a thickness of approximately 12 μm. The copper plating used in this step is filled plating where the opening portions of the resin substrate 10 are filled and an upper surface of the metal portion M1 are plated so as to be flat.

Figure 15:
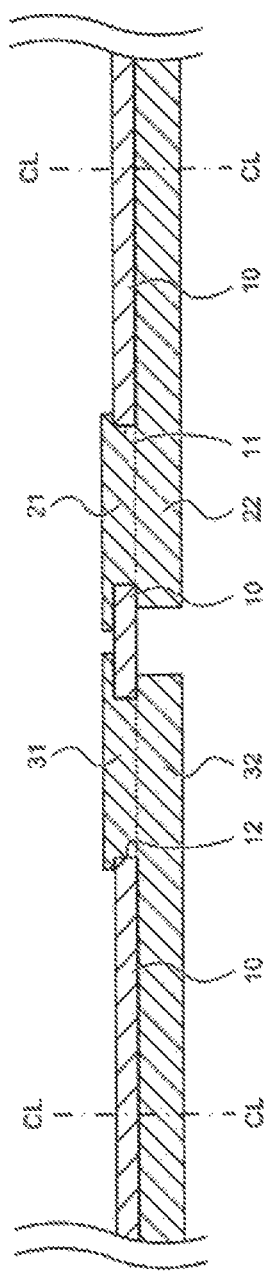

Next, as illustrated in FIG. 15, a wiring electrode forming step of forming patterns of the metal portions M1 and M2 into the shapes of the first wiring electrode 20 and the second wiring electrode 30 (Step S16, a second pattern forming step). On the upper surface 10S1 side of the resin substrate 10, for example, a mask where the shapes of the portions on the upper surface 10S1 of the resin substrate 10 of the first electrode portion 21, the second electrode portion 31, the first wiring portion 22, and the second wiring portion 32 are patterned is applied to the upper surface of the first copper foil F1. On the lower surface 10S2 side of the resin substrate 10, for example, a mask where the shapes of portions on the lower surface 10S2 of the resin substrate 10 of the first wiring portion 22 and the second wiring portion 32 are patterned is applied to the lower surface of the second copper foil F2. After that, by applying etching from the upper side and the lower side, the first wiring electrode 20 and the second wiring electrode 30 are patterned on the upper surface 10S1 and the lower surface 10S2 of the resin substrate 10. In other words, the manufacturing method of the light-emitting device 100 includes the wiring electrode forming step of forming the patterns of the metal portion M1 made of the first copper foil F1 and the copper plating layer and the metal portion M2 made of the second copper foil F2 and the copper plating layer into the shapes of the first wiring electrode 20 and the second wiring electrode 30, on the upper surface 10S1 and the lower surface 10S2.

Figure 16:
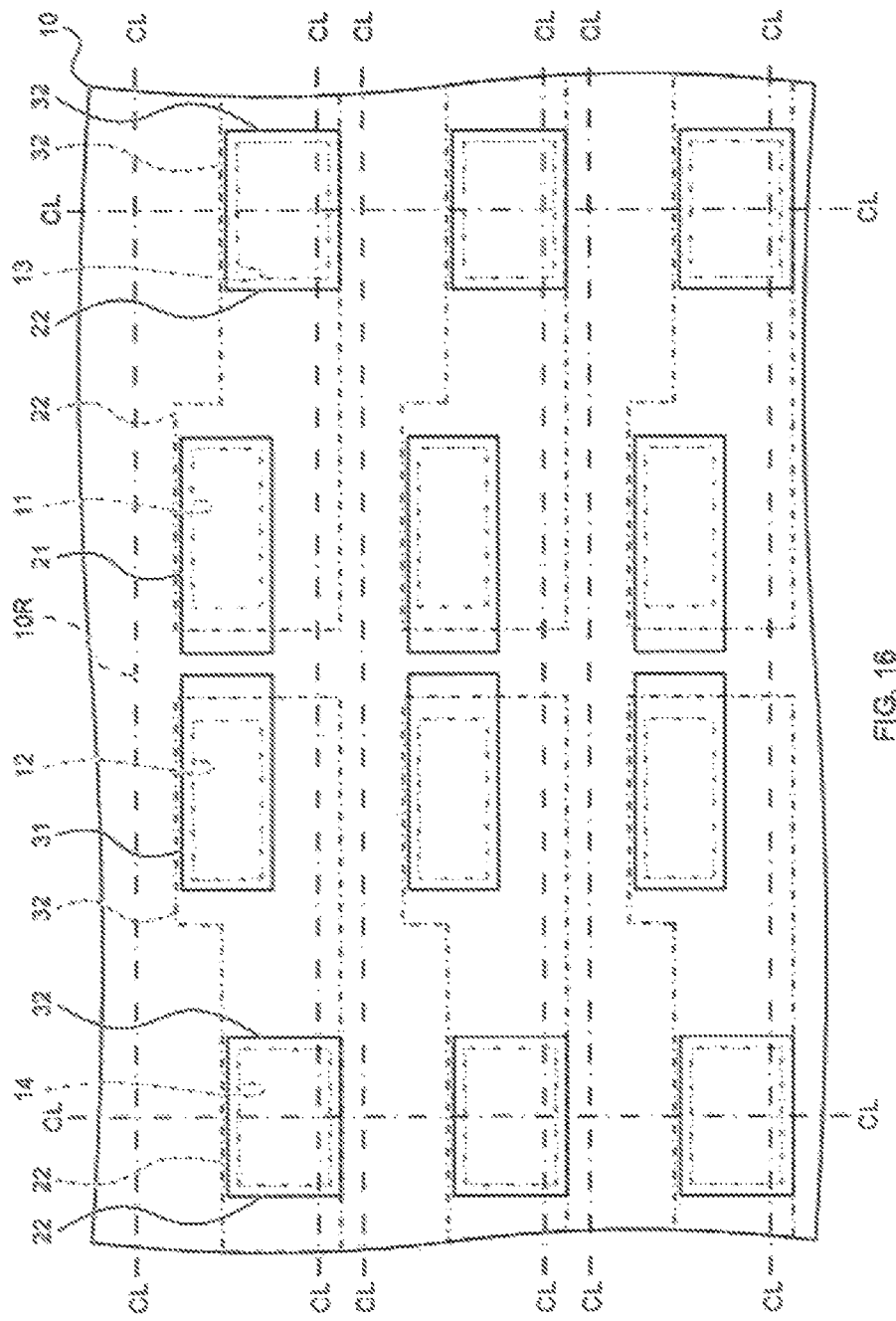
FIGS. 16, 17, and 18 are top views in one step in manufacturing the light-emitting device according to the embodiment of the present invention.

As illustrated in FIG. 16, in this step, the respective first wiring portion 22 and second wiring portion 32 of the substrates 10 adjacent to one another in the long side direction of the resin substrate 10 are collectively formed. That is, in the first wiring portion 22 and the second wiring portion 32 formed on the resin substrate 10, with the cut line CL interposed therebetween, one becomes the first wiring portion 22 and the other becomes the second wiring portion 32. In this step, each of the first wiring portion 22 and the second wiring portion 32 are formed so as to extend up to the waste region adjacent on the side of the cut line CL corresponding to the first long side 10E of the resin substrate 10. As described above, the first wiring portion 22 and the second wiring portion 32 are formed so as to expose the lower surface 10S2 of the resin substrate 10 in the region along the cut line CL corresponding to the second long side opposed to the first long side 10E of the resin substrate 10. In other words, in the manufacturing method of the light-emitting device 100, in the wiring electrode forming step, the first wiring electrode 20 and the second wiring electrode 30 are formed so as to expose the region along the second long side opposed to the first long side of the rectangle 10R on the lower surface 10S2 side.

Figure 17:
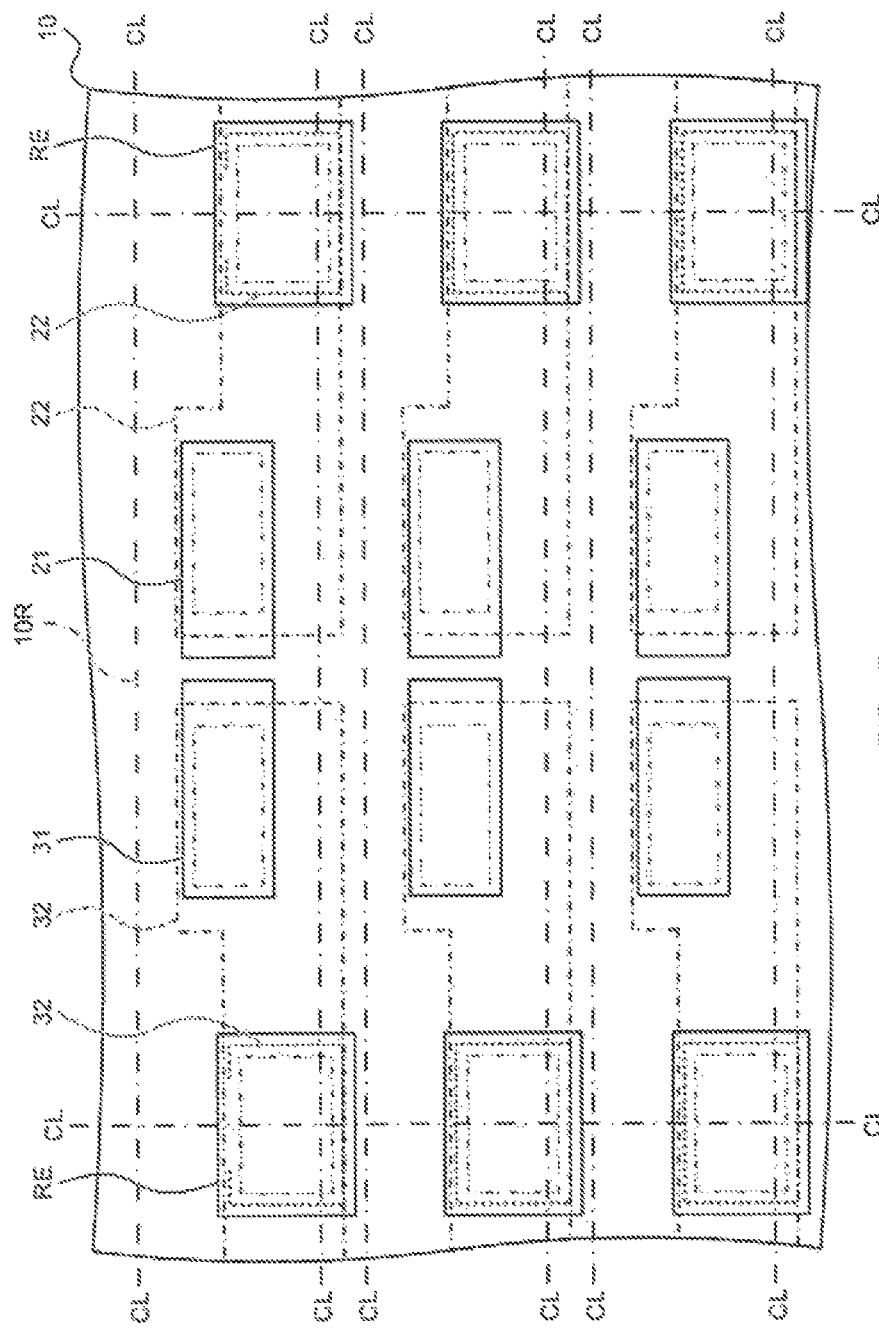

Next, as illustrated in FIG. 17, the resist RE is formed so as to cover each of the first wiring portion 22 and the second wiring portion 32 formed on the upper surface 10S1 side of the resin substrate 10 (Step S17, a resist forming step). In this step, the resist RE is formed up to a region equal to or more than approximately 100 μm from the end portions of the first wiring portion 22 and the second wiring portion 32 on the upper surface 10S1 of the resin substrate 10.

Next, the Ni/Au metal layer is formed by plating so as to cover the surfaces of the first wiring electrode 20 and the second wiring electrode 30 except the surfaces covered with the resist RE (Step S18, a second plating step). In this embodiment, the Ni/Au metal layer is formed by using electrolytic plating. Accordingly, the Ni/Au metal layer is not formed on the exposed surface of the resin substrate 10 or the surfaces of the resist RE.

Figure 18:
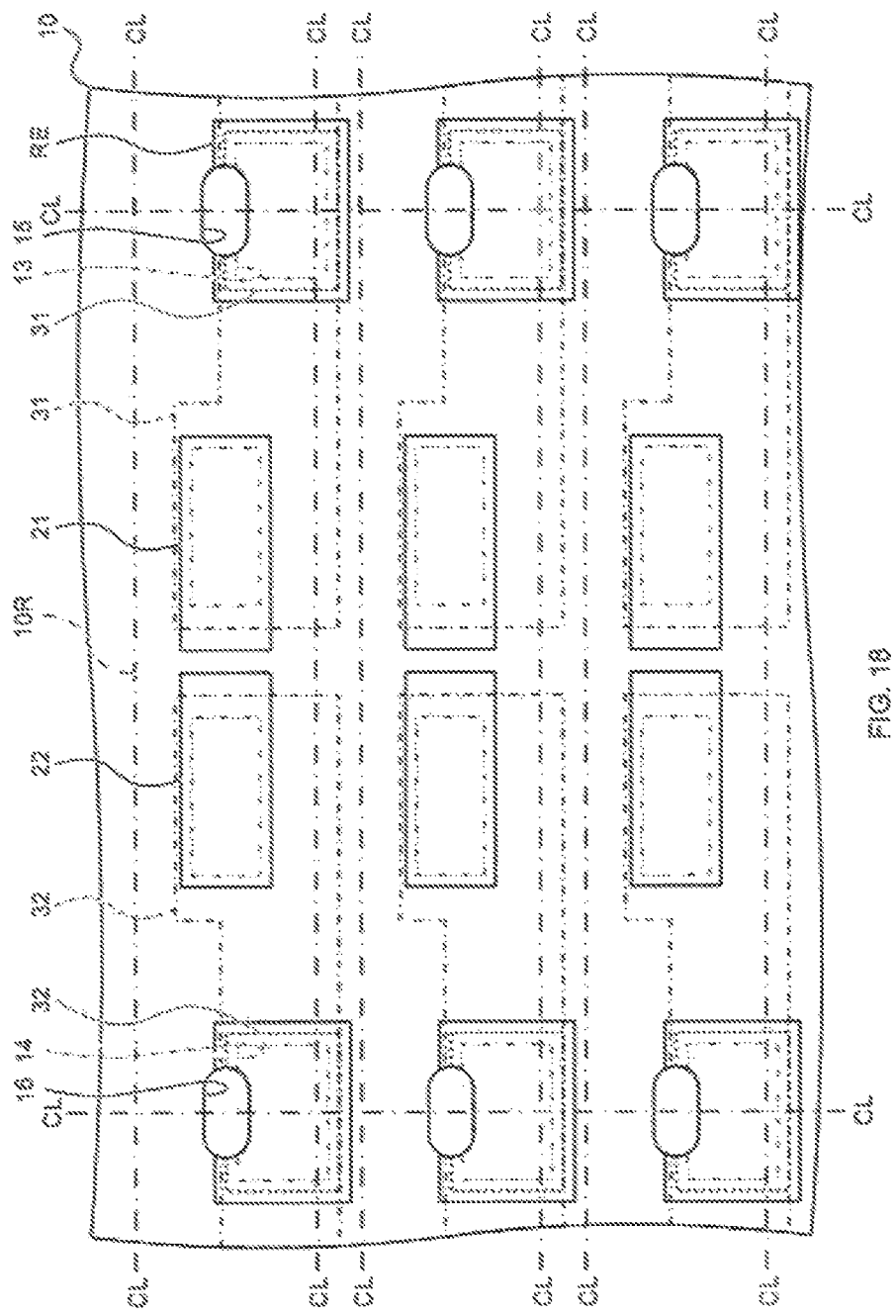

Next, as illustrated in FIG. 18, the third through hole 15 and the fourth through hole 16 passing through each of the resist film, the first wiring portion 22, the second wiring portion 32, and the resin substrate 10 are formed at each of the short sides in the region of the rectangle 10R defined by the cut lines CL of the resin substrate 10 (Step S19, a second through hole forming step). In this step, the through holes having the circular shape or the oblong shape are formed at each of the short sides in the region of the rectangle 10R defined by the cut lines CL of the resin substrate 10. In this embodiment, the through holes are formed by, for example, a drill. In the through holes formed in the resin substrate 10, with the cut line CL interposed therebetween, one becomes the third through hole 15 and the other becomes the fourth through hole 16.

Thus, by performing the step (Step S19) of forming the third through hole 15 and the fourth through hole 16 after the step of forming the Ni/Au metal layer by plating, the side surfaces of the first wiring portion 22 and the second wiring portion 32 can be formed in the shapes along the inner walls of the third through hole 15 and the fourth through hole 16. The side surfaces of the first wiring portion 22 and the second wiring portion 32 formed so as to extend along the inner walls of the third through hole 15 and the fourth through hole 16 can be formed as the side surfaces constituted of the copper foil, copper plating, and the resist RE and can be formed as the side surfaces having high adhesiveness with the resin body 50.

Figure 19:
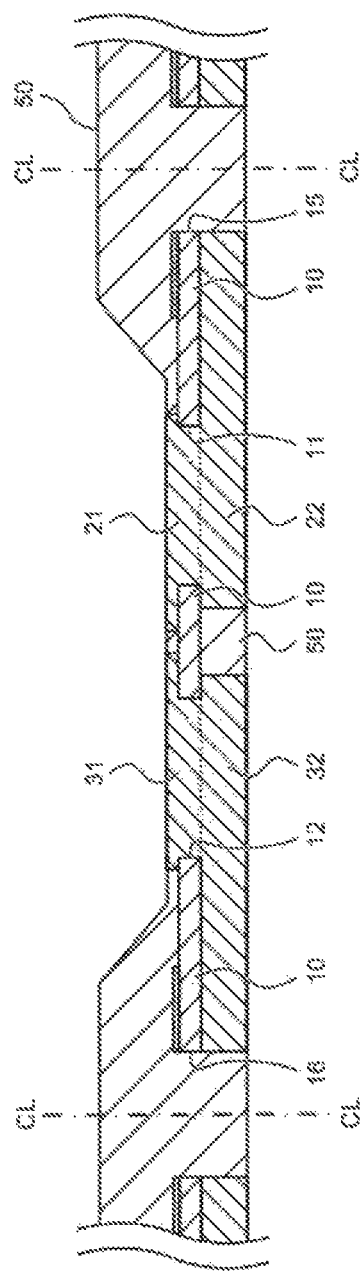
FIGS. 19, 20, 21, and 22 are cross-sectional views in one step in manufacturing the light-emitting device according to the embodiment of the present invention.

Next, as illustrated in FIG. 19, a resin body forming step of forming the resin body 50 on the upper surface 10S1 and the lower surface 10S2 of the resin substrate 10 is performed (Step S20, a resin frame body forming step). In this step, the resin body 50 is molded by setting the resin substrate 10 into a molding die of an injection molding machine and pouring a resin as a raw material of the resin body 50 in the molding die by a transfer molding method. In this case, on the lower surface 10S2 side of the resin substrate 10, a planar-shaped lower die of the molding die is set, and the first wiring portion 22 and the second wiring portion 32 are set such that the lower surfaces of the first wiring portion 22 and the second wiring portion 32 are in contact with the lower die. On the upper surface 10S1 side of the resin substrate 10, an upper die of the molding die having a convex portion having a shape similar to the shape of the cavity inner surface of the resin body 50 is set such that the upper surfaces of the first electrode portion 21 and the second electrode portion 31 are in contact with a lower surface of the upper die.

The resin body 50 is formed by pouring a raw material resin of the resin body 50 inside the molding die in this state, filling the raw material resin inside the molding die, and curing the raw material resin by heating the die. The raw material resin is poured from the side of one surface of the upper surface 10S1 or the lower surface 10S2 of the resin substrate 10, flows to the side of the other surface via the third through hole 15 and the fourth through hole 16, and is filled inside the molding die. Since the raw material resin is filled such that the lower die of the molding die is in contact with the lower surfaces of the first wiring portion 22 and the second wiring portion 32, and the lower surface of the upper die of the molding die is in contact with the upper surfaces of first electrode portion 21 and the second electrode portion 31, the upper surfaces of the first electrode portion 21 and the second electrode portion 31 and the lower surfaces of the first wiring portion 22 and the second wiring portion 32 are exposed from the resin body 50. In other words, the manufacturing method of the light-emitting device 100 includes the resin body forming step of forming the light reflective resin body 50 so as to form the frame body that surrounds the element mounting region on the upper surface 10S1 and cover the regions exposed from the first wiring electrode 20 and the second wiring electrode 30 on the lower surface 10S2.

The bottom surface of the cavity of the resin body 50 is preferably formed to have a height equal to or less than the upper surfaces of the first electrode portion 21 and the second electrode portion 31. By forming bottom surface of the cavity of the resin body 50 to have a height equal to or less than the upper surfaces of the first electrode portion 21 and the second electrode portion 31, it is possible to reduce, for example, mounting position misalignment of the light-emitting element 60 during an element bonding step.

Figure 20:
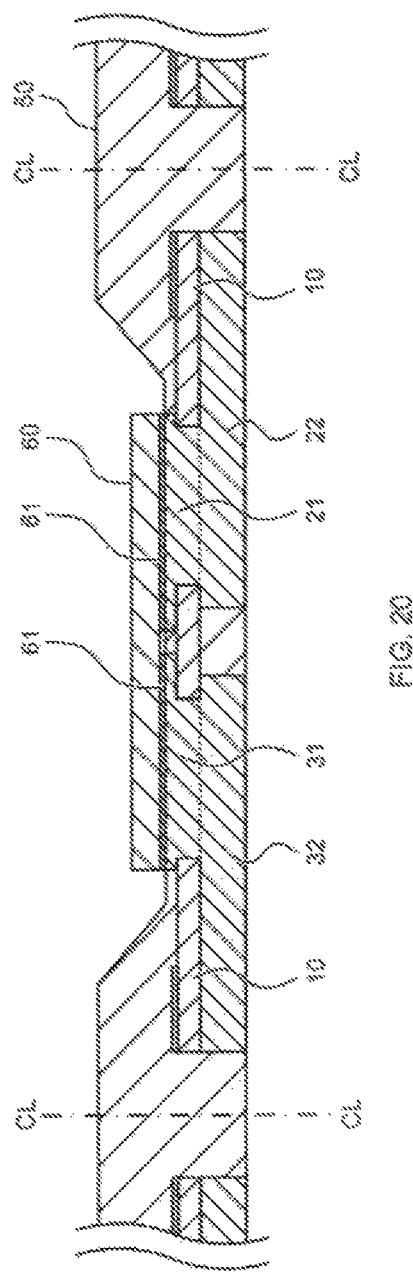

Next, as illustrated in FIG. 20, the element bonding step of mounting and bonding the light-emitting element 60 on the respective upper surfaces of the first electrode portion 21 and the second electrode portion 31 (Step S21, the element bonding step). In this step, first, a paste mixed with Au—Sn alloy particles being a raw material of the element bonding layer 61 is applied by using a dispenser on the respective upper surfaces of the first electrode portion 21 and the second electrode portion 31. Subsequently, the light-emitting element 60 is mounted such that electrode surfaces of a cathode and an anode of the light-emitting element 60 are in contact with the respective pastes. By causing the Au—Sn particles to be melted by heating the resin substrate 10 in this state at approximately 280° C. and causing the molten Au—Sn particles to react eutectically with the Au layer of the metal layer formed on the respective upper surfaces of the first electrode portion 21 and the second electrode portion 31, the respective electrodes of the light-emitting element 60 are eutectically bonded to each of the first electrode portion 21 and the second electrode portion 31. In other words, the manufacturing method of the light-emitting device 100 includes the element bonding step of mounting the light-emitting element 60 on the respective upper surfaces of the first electrode portion 21 of the first wiring electrode 20 and the second electrode portion 31 of the second wiring electrode 30 on the upper surface 10S1 side.

Figure 21:
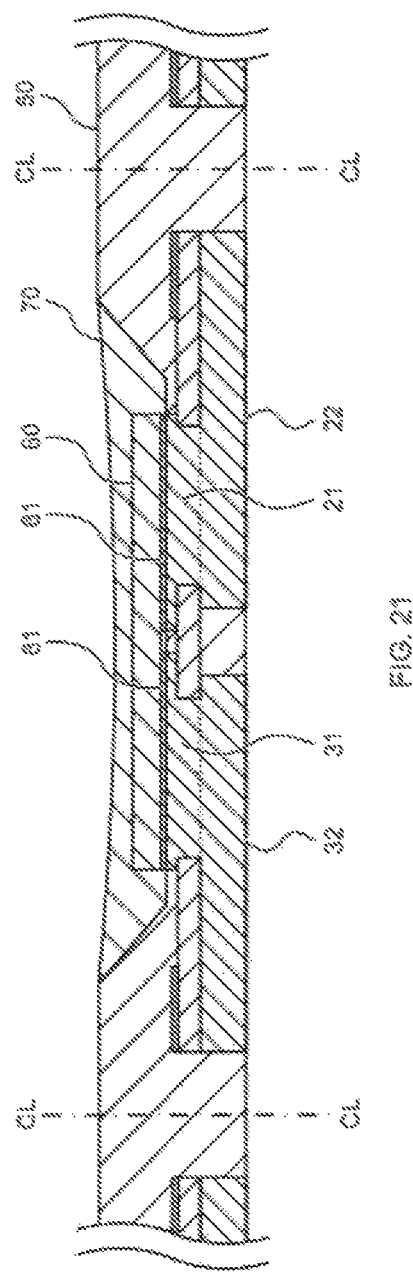

Next, as illustrated in FIG. 21, the sealing resin 70 is filled inside the respective cavities of the resin bodies 50 (Step S22, a sealing resin filling step). In this step, the sealing resin 70 is filled inside the cavity using a dispenser so as to cover the light-emitting element 60, and seals the light-emitting element 60. This forms a plurality of light-emitting devices 100 in a matrix in the resin substrate 10.

Figure 22:
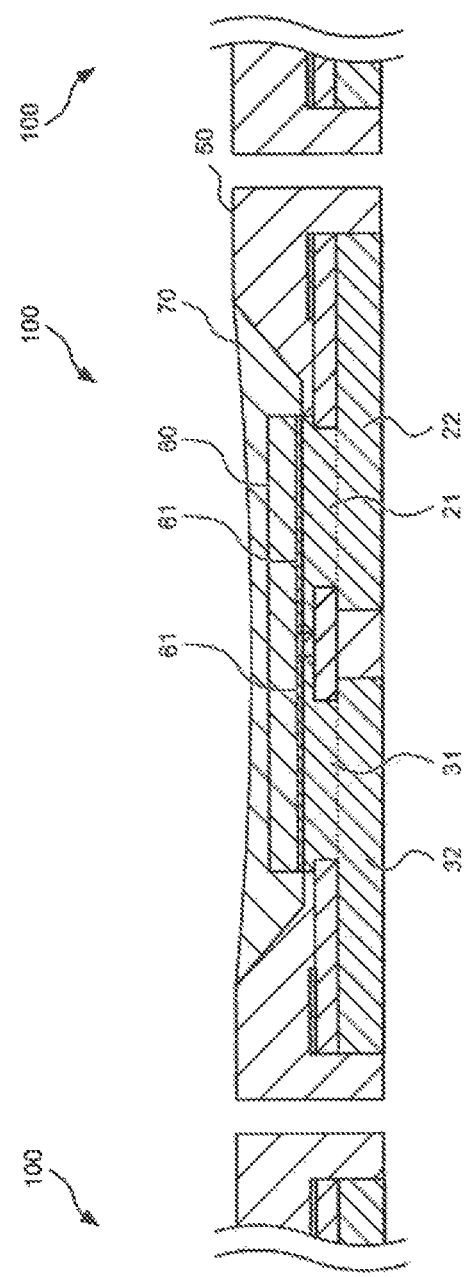

Next, as illustrated in FIG. 22, each of the plurality of light-emitting devices 100 is individualized by performing the dicing along the cut lines CL (Step S23, a dicing step). In this step, first, the dicing is performed in the direction of the long side of the light-emitting device 100. Then, in the direction of the short side, the dicing is performed from the side of the first long side 10E of the resin substrate 10 where the first wiring portion 22 and the second wiring portion 32 are formed toward the side of the second long side opposed to the first long side. This allows reducing metal burrs on the exposed surfaces of the first wiring portion 22 and the second wiring portion 32 exposed on the side surfaces of the light-emitting device 100 during the dicing.

The metal burrs is likely to occur by thermal expansion of the metal portion due to heat generation during the dicing. In a dicing direction, when the metal portion is disposed at an end portion in a direction perpendicular to the dicing direction where the metal portion and space, for example, air are disposed in this order, the metal portion expands by heat in the dicing direction, and the metal burrs is likely to occur.

In the embodiment, as described above, after performing the dicing in the long side direction of the light-emitting device 100, the dicing is performed from the side of the first long side 10E where the first wiring portion 22 and the second wiring portion 32 of the light-emitting device 100 are disposed to the short side direction. That is, performing the dicing in the direction where there is no space for the first wiring portion 22 and the second wiring portion 32 to expand by heat allows reduced occurrence of the metal burrs.

Next, Au plating is applied to the exposed surfaces of the first wiring portion 22 and the second wiring portion 32 of the individualized light-emitting device 100 (Step S24, a third plating step). The plating with Au at Step S24 can be conveniently applied.

By performing the above-described processing, the light-emitting device 100 is manufactured.

According to the embodiment, in the first wiring electrode 20 and the second wiring electrode 30, the thickness of the portion formed on the lower surface 10S2 of the resin substrate 10 is made larger than the total thickness of the resin substrate 10 and the portions formed on the upper surface 10S1. On the lower surface 10S2 side of the resin substrate 10, the resin body 50 is formed over both ends of the light-emitting device 100 in the direction along the long side of the light-emitting device 100. On the upper surface 10S1 of the resin substrate 10, the thickness of the inner wall of the cavity of the resin body 50 in the direction along the long side direction of the resin substrate 10 is made small.

This allows the light-emitting device 100 to have the close volume amount between the resin body 50 disposed on the upper surface 10S1 side of the substrate 10 and the resin body 50 disposed on the lower surface 10S2 side of the substrate 10. Forming the resin body 50 over both ends in the direction along the long side direction on the lower surface 10S2 of the substrate 10 allows the light-emitting device 100 to reduce stress concentration during shrinkage after the heat treatment of the resin body 50 disposed on the upper surface 10S1 of the substrate 10. Consequently, in the light-emitting device 100, it is possible to improve the manufacturing yield by reducing the variation of the warpage amount of the mounting substrate between the high temperature period at, for example, the heat treatment during manufacturing and the normal temperature state.

In the embodiment, the case where one cavity is disposed on the light extraction surface of the light-emitting device 100, and one light-emitting element 60 is mounted inside the cavity is described. However, the number of cavities included in the light-emitting device 100 and the number of mounted light-emitting elements 60 are not limited to this.

Figure 23:
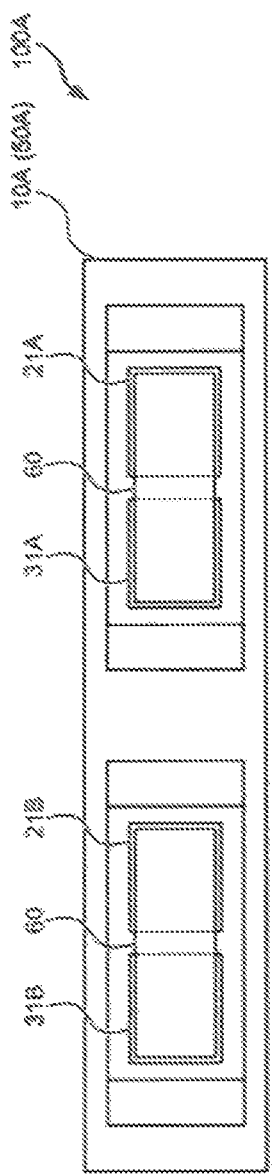
FIG. 23 is a top view of a light-emitting device according to a modification of the present invention.
Figure 24:
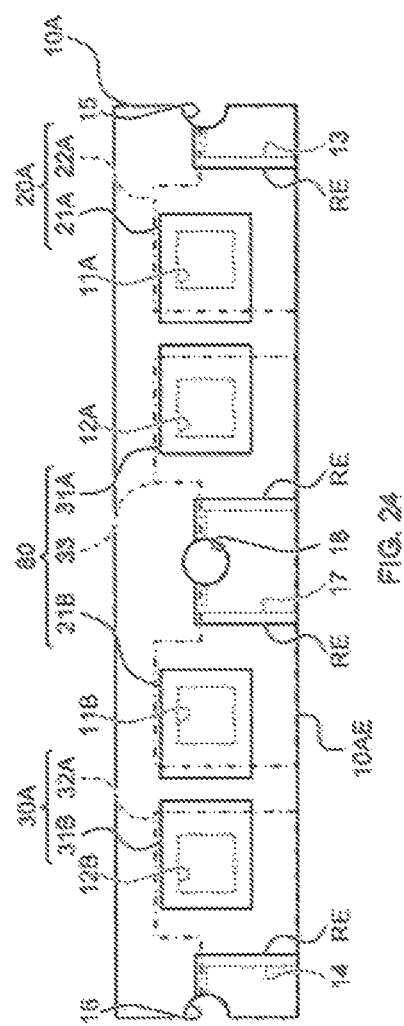
FIG. 24 is a top view of a resin substrate and wiring electrodes according to the modification of the present invention.

FIG. 23 is a top view of a light-emitting device 100A according to a modification of the embodiment. FIG. 24 is a top view of each of a resin substrate 10A and wiring electrodes formed on the resin substrate 10A of the light-emitting device 100A according to the modification of the embodiment. In FIG. 23, in order to indicate a structure inside a cavity of a resin body 50A, illustration of the sealing resin 70 is omitted.

The light-emitting device 100A basically has a constitution similar to that of the light-emitting device 100 of the embodiment. In this modification, the light-emitting device 100A is different from the embodiment in that two cavities are formed on an upper surface of the resin body 50A and the light-emitting elements 60 are mounted inside the respective cavities, respectively.

As illustrated in FIG. 24, the resin substrate 10A of the light-emitting device 100A has a cutout portion 17 where a center region of a first long side 10AE as one long side is cut out from the upper surface shape of the rectangle 10R.

The resin substrate 10A has a circular or an oval fifth through hole 18 passing through from the upper surface up to a lower surface so as to be in contact with the cutout portion 17, in the center region of the upper surface of the resin substrate 10A.

The resin substrate 10A has a first through hole 11A and a second through hole 12A that are a pair of through holes separated from one another and pass through from the upper surface up to the lower surface in a region between the cutout portion 17 and the cutout portion 13. The resin substrate 10A has a first through hole 11B and a second through hole 12B that are a pair of through holes separated from one another and pass through from the upper surface up to the lower surface in a region between the cutout portion 17 and the cutout portion 14.

On the resin substrate 10A, a first electrode portion 21A filling the through hole 11A and formed up to a region of the upper surface of the resin substrate 10A and a second electrode portion 31A filling the through hole 12A and formed up to a region of the upper surface of the resin substrate 10A are formed. On the resin substrate 10A, a first electrode portion 21B filling the through hole 11B and formed up to a region of the upper surface of the resin substrate 10A and a second electrode portion 31B filling the through hole 12B and formed up to a region of the upper surface of the resin substrate 10A are formed. On the lower surface of the resin substrate 10A, a first wiring electrode 20A constituted of a first wiring portion 22A extending from a portion of the first electrode portion 21A on the lower surface of the resin substrate 10A to the upper surface through the side surface of the cutout portion 13 is formed. On the lower surface of the resin substrate 10A, a second wiring electrode 30A constituted of a second wiring portion 32A extending from a portion of the second electrode portion 31B on the lower surface of the resin substrate 10A to the upper surface through the side surface of the cutout portion 14 is formed. On the lower surface of the resin substrate 10A, a third wiring electrode 80 constituted of a third wiring portion 33 extending from each of a portion of the second electrode portion 31A and a portion of the first electrode portion 21B on the lower surface of the resin substrate 10A to the upper surface through the side surface of the cutout portion 17 is formed. That is, the second electrode portion 31A is electrically connected to the first electrode portion 21B via the third wiring portion 33. The resin substrate 10A of the modification has a shape where the resin substrate 10 and the respective wiring electrodes of the embodiment are connected in the direction along the long side direction.

Each light-emitting element 60 is mounted onto each of a set of the first electrode portion 21A and the second electrode portion 31A and a set of first electrode portion 21B and second electrode portion 31B. That is, each of the light-emitting elements 60 mounted onto each of the set of the first electrode portion 21A and the second electrode portion 31A and the set of the first electrode portion 21B and the second electrode portion 31B has one electrode electrically connected with one another.

At this time, each of the light-emitting elements 60 may be disposed such that both cathode electrodes or both anode electrodes are electrically connected with one another, or the anode electrode of one light-emitting element 60 and the cathode electrode of the other light-emitting element 60 may be electrically connected with one another. Specifically, when both cathode electrodes or both anode electrodes of each of the light-emitting elements 60 are electrically connected with one another, it is possible to drive the light-emitting elements 60 in a parallel connection by setting the third wiring electrode 80 to a ground potential and applying a voltage to each of the first wiring electrode 20A and the second wiring electrode 30A. When the anode electrode of one light-emitting element 60 and the cathode electrode of the other light-emitting element 60 are electrically connected with one another, it is possible to drive the light-emitting elements 60 in a serial connection by setting the third wiring electrode 80 to an intermediate electric potential and applying a voltage between the first wiring electrode 20A and the second wiring electrode 30A.

In this modification, while the case where the light-emitting device 100A has two cavities, and two light-emitting elements 60 are mounted, the light-emitting device 100A may have three or more cavities, and three or more light-emitting elements 60 may be mounted. A plurality of light-emitting elements 60 may be mounted inside a cavity.

Also in the light-emitting device 100A of the modification, similarly to the embodiment, in the first wiring electrode 20A, the second wiring electrode 30A, and the third wiring electrode 80, thicknesses of the portions formed on the lower surface of the resin substrate 10A are made larger that a total thickness of the resin substrate 10A and the portions formed on the upper surface. On the lower surface side of the resin substrate 10A, the resin body 50A is formed over both ends of the light-emitting device 100A in the direction along the long side of the light-emitting device 100A.

Therefore, also in the light-emitting device 100A of the modification, it is possible to improve the manufacturing yield by reducing the variation of the warpage amount of the mounting substrate between the high temperature period at, for example, the heat treatment during manufacturing and the normal temperature state.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No.

2021-072385 filed on Apr. 22, 2021, the entire contents of which are incorporated herein by reference.

What is claimed is:

1. A light-emitting device comprising:
    a resin substrate having a flat plate shape, the resin substrate having a planar surface shape where a first region including an apex at one end of one long side of a rectangle and a second region including an apex at the other end of the one long side of the rectangle are cut out, and the resin substrate having a first through hole and a second through hole passing therethrough from a first principal surface up to a second principal surface thereof;
    a first wiring electrode made of metal and including:
        a first electrode portion filling the first through hole; and
        a first wiring portion that extends from the first electrode portion on the second principal surface side up to the first principal surface via a side surface facing the first region of the resin substrate, while leaving a region along the other long side of the rectangle of the resin substrate on the first principal surface and the second principal surface exposed;
    a second wiring electrode made of metal and including:
        a second electrode portion filling the second through hole; and
        a second wiring portion that extends from the second electrode portion on the second principal surface side up to the first principal surface via a side surface facing the second region of the resin substrate, while leaving a region along the other long side of the rectangle of the resin substrate on the first principal surface and the second principal surface exposed;
    a light-emitting element mounted onto the first and second electrode portions on the first principal surface side of the resin substrate; and
    a resin body having a light reflection property, the resin body covering the first principal surface of the resin substrate, covering the first and second wiring portions and forming a frame body surrounding the light-emitting element on the first principal surface, and covering a region on the second principal surface of the resin substrate left exposed by the first wiring electrode and the second wiring electrode,
    wherein a thickness of each of the first wiring electrode and the second wiring electrode on the second principal surface is larger than the thickness thereof on the first principal surface.

2. The light-emitting device according to claim 1, wherein the thickness of each of the first wiring electrode and the second wiring electrode on the second principal surface is larger than a total thickness of the thickness thereof on the first principal surface and a thickness of the resin substrate.

3. The light-emitting device according to claim 1, wherein each of the first wiring electrode and the second wiring electrode extends on the second principal surface from its respective electrode portion to a region along the one long side of the rectangle of the resin substrate.

4. The light-emitting device according to claim 1, wherein the resin body has a thermal expansion coefficient higher than thermal expansion coefficients of the resin substrate, the first wiring electrode, and the second wiring electrode.

5. The light-emitting device according to claim 1, wherein the resin body is made of epoxy resin containing glass fibers.

6. The light-emitting device according to claim 1, wherein:
    the first wiring electrode and the second wiring electrode are made of copper, and
    surfaces of the first and second electrode portions which are exposed from the resin substrate have a metal layer where nickel and gold are stacked in this order.

7. The light-emitting device according to claim 1, wherein the first and second wiring portions, on the first principal surface, have respective surfaces covered by a resist except for side surfaces thereof along the side surfaces of the resin substrate.

8. A manufacturing method for manufacturing a plurality of light-emitting devices, the manufacturing method comprising:
    a resin substrate preparation step of preparing a resin substrate having a plurality of element mounting regions defined in a shape of a rectangle by grid-like dividing lines on a first principal surface thereof;
    a copper foil adhering step of adhering a first copper foil onto the first principal surface of the resin substrate and adhering a second copper foil having a greater thickness than the first copper foil onto a second principal surface opposed to the first principal surface of the resin substrate;
    a substrate shape forming step of forming, in each of the element mounting regions, (i) cutout portions where a first region including an apex at one end of one long side of the rectangle and a second region including an apex at the other end of the one long side of the rectangle are cut out, and (ii) a first through hole and a second through hole where two regions of the element mounting region pass through from the first copper foil up to the second principal surface;
    a copper plating step of forming a metal layer made of copper so as to fill the cutout portions, the first through hole, and the second through hole, and so as to cover an upper surface of the first copper foil and a lower surface of the second copper foil;
    a wiring electrode forming step of forming patterns of the first copper foil, the second copper foil, and the metal layer into shapes of first wiring electrodes and second wiring electrodes, on the first principal surface and the second principal surface;
    a resin body forming step of forming a resin body having a light reflection property so as to form a frame body surrounding the element mounting regions on the first principal surface and so as to cover regions on the second principal surface exposed from the first wiring electrodes and the second wiring electrodes; and
    an element bonding step of mounting light-emitting elements on upper surfaces of respective pairs of the first wiring electrodes and the second wiring electrodes on the first principal surface side,
    wherein each of the plurality of light-emitting devices comprises the light-emitting device according to claim 1.

9. The manufacturing method according to claim 8, wherein the wiring electrode forming step includes forming the first wiring electrodes and the second wiring electrodes so as to leave the regions on the second principal surface side exposed.

* * * * *